US011433633B2

(12) United States Patent
Calisch et al.

(10) Patent No.: US 11,433,633 B2
(45) Date of Patent: Sep. 6, 2022

(54) FABRICATION OF THREE-DIMENSIONAL KIRIGAMI STRUCTURES WITH TUNABLE PROPERTIES

(71) Applicant: Massachusetts Institute of Technology, Cambridge, MA (US)

(72) Inventors: Samuel Eli Calisch, Cambridge, MA (US); Neil A. Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 146 days.

(21) Appl. No.: 15/391,745

(22) Filed: Dec. 27, 2016

(65) Prior Publication Data

US 2017/0182723 A1   Jun. 29, 2017

Related U.S. Application Data

(60) Provisional application No. 62/271,271, filed on Dec. 27, 2015.

(51) Int. Cl.
  *B29D 99/00*   (2010.01)
  *B29C 53/36*   (2006.01)
  (Continued)

(52) U.S. Cl.
  CPC ........ *B29D 99/0089* (2013.01); *A43B 1/0009* (2013.01); *B29C 53/36* (2013.01);
  (Continued)

(58) Field of Classification Search
  CPC .. B29D 99/0089; B29D 35/122; B29C 53/36; B29C 53/80; B31D 3/0207; B64C 3/20;
  (Continued)

(56) References Cited

U.S. PATENT DOCUMENTS 5,006,391 A * 4/1991 Biersach .................. B32B 3/12
                                                    428/116
5,137,768 A * 8/1992 Lin ........................ D21H 13/26
                                                    162/157.3
(Continued)

FOREIGN PATENT DOCUMENTS

DE    102006056353    12/2007
WO    WO 2008/141688  11/2008

OTHER PUBLICATIONS

PCT International Search Report/Written Opinion, PCT/US2016/068065, US ISA, dated Apr. 3, 2017.

*Primary Examiner* — Sameh Tawfik
(74) *Attorney, Agent, or Firm* — Norma E. Henderson

(57) ABSTRACT

A method of forming a structural honeycomb includes cutting and folding a substrate sheet according to predetermined cutting and folding patterns and fold angles that cause the sheet to form a honeycomb having cells that each have at least one face abutting, or nearly abutting, the face of another cell. The honeycomb is then stabilized by joining abutting, or nearly abutting, faces to hold the honeycomb together. The honeycomb may have a prespecified three-dimensional shape. The folding pattern may include corrugation, canted corrugation, or zig-zag folds. Joining may employ fixed and/or reversible joinery, including slotted cross section, tabbed strip, angled strip, integral skin, sewn, or laced. At least some folds may be partially-closed to create bends and twists in the honeycomb structure. Some surfaces of the honeycomb may be covered with a skin or face sheet. The substrate sheet may have flexible electronic traces.

15 Claims, 16 Drawing Sheets

(51) Int. Cl.
*H05K 1/02* (2006.01)
*B64C 3/20* (2006.01)
*B31D 3/02* (2006.01)
*F21V 1/18* (2006.01)
*A43B 1/00* (2006.01)
*B29C 53/80* (2006.01)
*F21Y 109/00* (2016.01)
*F21Y 115/10* (2016.01)
*B29C 53/28* (2006.01)

(52) U.S. Cl.
CPC .............. *B31D 3/0207* (2013.01); *B64C 3/20* (2013.01); *F21V 1/18* (2013.01); *H05K 1/028* (2013.01); *B29C 53/285* (2013.01); *B29C 53/80* (2013.01); *F21Y 2109/00* (2016.08); *F21Y 2115/10* (2016.08); *H05K 2201/055* (2013.01); *H05K 2201/09045* (2013.01)

(58) Field of Classification Search
CPC ....... F21V 1/18; H05K 1/028; F21Y 2109/00; F21Y 2115/10
USPC ......................................................... 493/480
See application file for complete search history.

(56) References Cited

U.S. PATENT DOCUMENTS

| | | | | |
|---|---|---|---|---|
| 5,415,715 | A * | 5/1995 | Delage | B29D 99/0089 156/197 |
| 5,421,935 | A * | 6/1995 | Dixon | B29C 65/18 156/197 |
| 5,730,920 | A * | 3/1998 | Marshall | B29C 70/085 264/214 |
| 5,789,059 | A * | 8/1998 | Nomoto | B29D 99/0089 428/116 |
| 5,894,044 | A * | 4/1999 | Norcom | B31D 3/0246 156/197 |
| 6,117,518 | A * | 9/2000 | Cawse | B29C 70/088 428/116 |
| 6,183,836 | B1 | 2/2001 | Pflug | |
| 6,599,609 | B2 * | 7/2003 | Johnson | B31D 3/0207 156/197 |
| 6,726,974 | B1 * | 4/2004 | Pflug | B29D 99/0089 264/280 |
| 7,695,662 | B2 * | 4/2010 | Oyama | B29D 22/00 156/197 |
| 8,668,855 | B2 * | 3/2014 | Bradford | B29C 47/0028 264/177.12 |
| 8,671,693 | B2 * | 3/2014 | Straza | B29D 99/0089 60/770 |
| 8,795,806 | B2 * | 8/2014 | Pflug | B29D 99/0089 264/48 |
| 9,259,889 | B2 * | 2/2016 | Streuber | B29D 99/0089 |
| 2009/0283635 | A1 * | 11/2009 | Gerken | B29D 24/005 244/117 R |
| 2011/0281063 | A1 * | 11/2011 | Levit | B32B 3/12 428/116 |

* cited by examiner

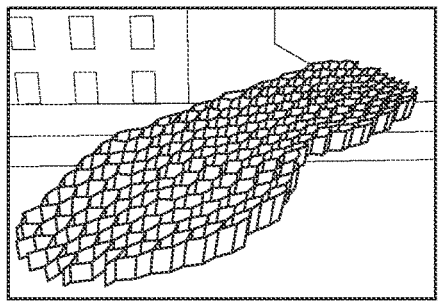
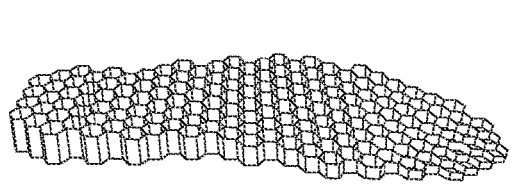
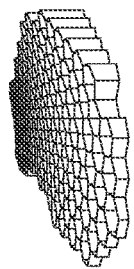
FIG. 14A  FIG. 14B  FIG. 14C
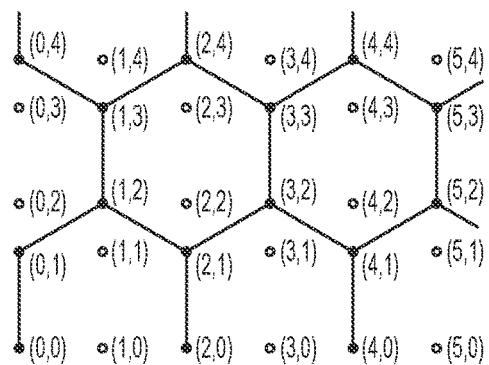
FIG. 15A
FIG. 15B
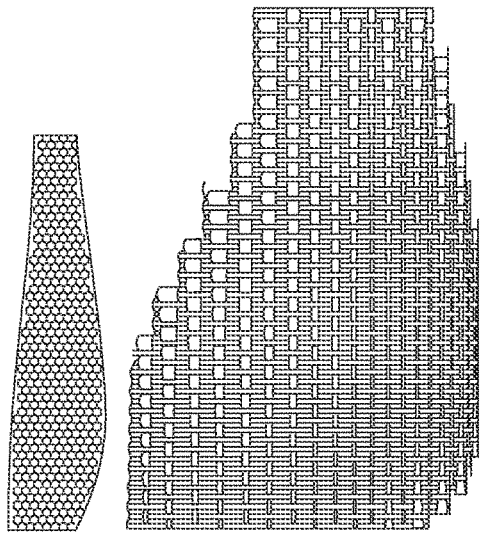
FIG. 16A  FIG. 16B

FABRICATION OF THREE-DIMENSIONAL KIRIGAMI STRUCTURES WITH TUNABLE PROPERTIES

RELATED APPLICATIONS

This application claims the benefit of U.S. Provisional Application Ser. No. 62/271,271, filed Dec. 27, 2015, the entire disclosure of which is herein incorporated by reference.

FIELD OF THE TECHNOLOGY

The present invention relates to structural materials and, in particular, to fabrication of structural honeycombs with tunable properties.

BACKGROUND

Structural honeycombs can provide weight and material savings for many engineering applications. Due to their relatively high costs of production, they are primarily used in fields where weight savings has the greatest benefits, such as, but not limited to, the aerospace industry. Where they are used, the shapes produced are typically flat, constant cross sections of a given thickness. These are generally produced by selective gluing of strips, followed by expansion. Alternative methods of production include scoring of corrugated panels and stamping/forming.

For many engineering applications, it is desirable to have shaped honeycombs, rather than simple flat panels. Milling unexpanded honeycomb is one way to produce three-dimensional honeycomb structures after expanding. This process requires tight tolerances, involves delicate post-machining expansion, and wastes a lot of material and machining time. Saito, Pellegrino, and Nojima describe the production of convex and concave constant cross section honeycombs with a cut-and-fold technique [Kazuya Saito, Sergio Pellegrino, Taketoshi Nojima, "Manufacture of Arbitrary Cross-Section Composite Honeycomb Cores Based on Origami Techniques", ASME Journal of Mechanical Design, May 2014, Vol. 136; Saito, K., Agnese, F., and Scarpa, F., "A Cellular Kirigami Morphing Wingbox Concept", J. Intell. Mater. Syst. Struct., Vol. 22, 2014, pp. 935-944]. This opens up many possibilities and makes efficient use of material, but in many cases even more control is desired, moving beyond constant cross section to more complex three-dimensional volumes.

SUMMARY

In one aspect, this application describes a cut-and-fold method to produce three-dimensional honeycombs in a net-shape process that avoids material waste from trimming. In another aspect, the invention is a structure formed from a three-dimensional honeycomb produced via the net-shape process. In another aspect, the invention is an apparatus for producing the three-dimensional honeycombs via the net-shape process.

In one particular aspect, the invention is a method of forming a structural honeycomb according to cut-and-fold instructions that comprise a predetermined cutting pattern and a predetermined folding pattern that are formulated according to parameters derived for creation of a three-dimensional honeycomb having specific properties, the method including the steps of:

(1) cutting a substrate sheet according to the predetermined cutting pattern;
(2) folding the cut substrate sheet according to the folding pattern and at least one predetermined fold angle, the fold angle being sufficient to cause the cut and folded substrate sheet to form a structural honeycomb having a plurality of cells that each has at least one face abutting, or nearly abutting, at least one face of another cell; and
(3) stabilizing the structural honeycomb by joining one or more abutting, or nearly abutting, honeycomb faces in a manner that holds the structural honeycomb together.

The cut-and-fold instructions may include instructions to include or exclude cells in order that the structural honeycomb will have a prespecified outline. The cut-and-fold instructions may include instructions to create a honeycomb wherein at least one of the top or bottom of the honeycomb forms an arbitrary shape along its length.

The folding pattern may specify at least corrugation folds, canted corrugation folds, or zig-zag folds.

The method may include the step of tuning the three-dimensional shape and material properties of the structural honeycomb by adjusting the parameters of the cut-and-fold instructions. Tuning may include adjusting an angle formed by the sides of each honeycomb cell by holding the cell width constant and changing the length of at least one cell side. Tuning may also include replacing corrugation folds with zig-zag folds to produce a prescribed stiffness in the direction of the honeycomb's thickness.

The step of stabilizing by joining may employ fixed and/or reversible joinery. Fixed joinery methods may include, but are not limited to, glue or spot welding. Reversible joinery methods may include, but are not limited to, at least one of slotted cross sections, tabbed strip joinery, angled strip joinery, an integral skin, sewn joinery, or laced joinery. The step of stabilizing by joining may include the step of constraining the width of the honeycomb cells by modifying features of a selected joining method. The step of stabilizing by joining may include the step of modifying features of a selected joining method to specify at least some partially-closed cross-sectional folds in order to create bends and twists in the honeycomb overall structure.

The method may include the step of at least partially covering at least one surface of the honeycomb with a skin or face sheet. The method may include using a substrate sheet that has at least one set of flexible electronic traces applied before at least one of the steps of cutting or folding.

In another aspect, the invention includes a structural honeycomb formed according to the method described methods and a structural honeycomb formed according to the described methods having an outer skin or face sheet.

In another particular aspect, the invention is a structure that comprises at least one three-dimensional structural honeycomb formed by a cut and folded substrate sheet that has been treated with a regular pattern of cut areas and folds, the folds having a folding angle that is sufficient to cause the cut and folded substrate sheet to form a honeycomb structure having a plurality of cells, with each cell having at least one face abutting at least one face of another cell, and at least one joinery mechanism attached to or between at least some abutting faces in a manner that stabilizes the structural honeycomb into a fixed shape. The structural honeycomb may be a volume-filling honeycomb. At least one of the top or bottom of the honeycomb may form an arbitrary shape along its length.

The structural honeycomb may have zig-zag corrugation and/or canted corrugation folds in at least one direction. At least some of the folds may be only partially closed.

The joinery mechanism may be at least glue or spot welding. The joinery mechanism may be reversible, and may include at least one of slotted cross sections, tabbed strip joinery, angled strip joinery, an integral skin, sewn joinery, or laced joinery. The joinery mechanism may function as a skin that covers at least part of the structure. The structure may include a skin or face sheet that at least partially covers at least one surface of the honeycomb.

The structure may include at least one set of flexible electronic traces applied to the substrate sheet and/or may include other electronic components. Structures according to the invention may in particular be advantageously used in aircraft wings or shoe soles.

BRIEF DESCRIPTION OF THE DRAWINGS

Other aspects, advantages and novel features of the invention will become more apparent from the following detailed description of the invention when considered in conjunction with the accompanying drawings wherein:

FIGS. 1A-D depict an example of basic flat uniform kirigami honeycomb construction, wherein FIG. 1A is a folding pattern for a uniform kirigami honeycomb sheet, FIG. 1B is a top view of a prototype according to the pattern of FIG. 1A, and FIGS. 1C and 1D are top and side views, respectively, of the prototype of FIG. 1B as the fold angles are increased.

FIGS. 2A-D depict a recreation of Saito's construction of a honeycomb with a sine wave as the top surface, and a parabola as the bottom surface, wherein FIG. 2A is an example folding pattern, FIG. 2B is a flat prototype according to the pattern of FIG. 2A, and FIGS. 2C and 2D depict the prototype of FIG. 2B as the fold angles are increased.

FIGS. 14A-C are top side and end views, respectively, of an example functional shape, a shoe sole, having a variable thickness.

FIGS. 15A and 15B depict a set of irregular honeycomb coordinates and a generic folding pattern, respectively, for construction of an example volume-filling honeycomb.

FIGS. 16A and 16B depict, respectively, a plan view of an example wind turbine blade shape, along with its folding diagram.

FIGS. 28A and 28B depict construction of an example shoe sole prototype according to the design of FIGS. 27A-C, wherein FIG. 28A depicts the flat, laser-cut material and FIG. 28B depicts the material of FIG. 28A after folding and stitching.

DETAILED DESCRIPTION

In one aspect, the invention is a cut-and-fold method for producing three-dimensional honeycombs. The methodology is similar to kirigami, which is a variation of origami that includes cutting of the paper, rather than solely folding the paper as in origami. The invention further includes structures constructed with three-dimensional honeycombs and apparatus for constructing the honeycombs.

Basic Construction.

Figure 1A:
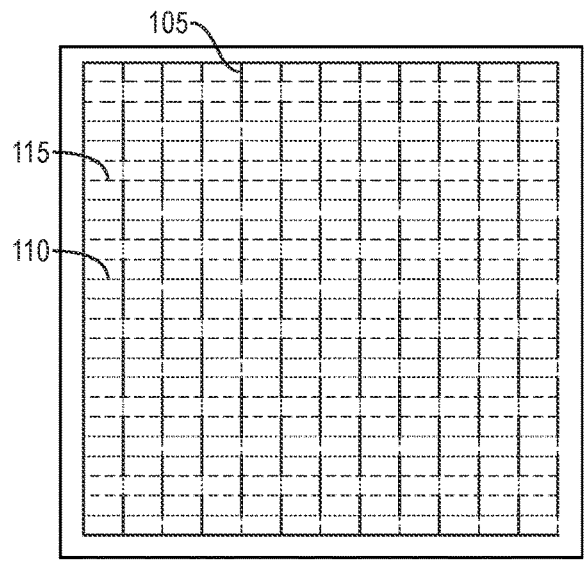

FIGS. 1A-D depict an example of basic flat uniform kirigami honeycomb construction. Through a series of cuts and score marks, a flat paper is developed into a three-dimensional honeycomb. FIG. 1A is a cut and folding pattern for a uniform kirigami honeycomb sheet. Shown in FIG. 1A is the cut-fold pattern, where blue lines 105 correspond to cuts, magenta lines 110 to mountain folds, and green lines 115 to valley folds.

Figure 1B:
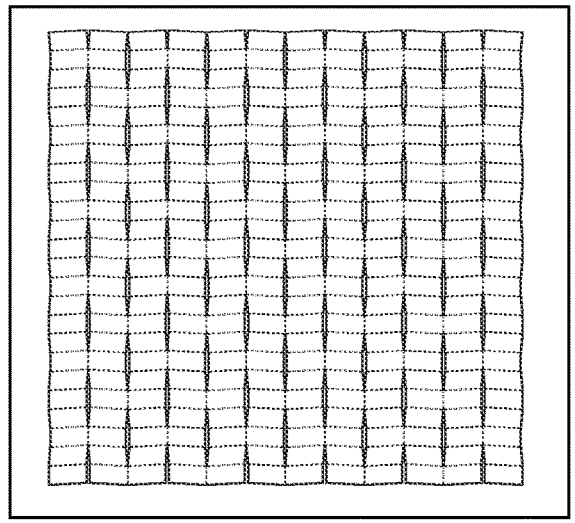

FIG. 1B is a top view of a paper prototype created according to the pattern of FIG. 1A. The paper prototype produced from this cut pattern, shown in FIG. 1B, is fabricated on a laser cutter. By assigning a lower power and a perforated pattern to the fold lines, the folds can be scored and easily creased by hand. It can be seen that the cuts, mountain folds, and valley folds in the prototype of FIG. 1B exactly correspond to the cut lines 105, mountain fold lines 110, and valley fold lines 115 of the pattern of FIG. 1A.

Figure 1C:
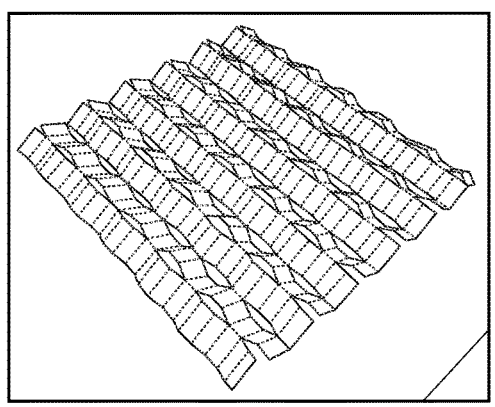
Figure 1D:
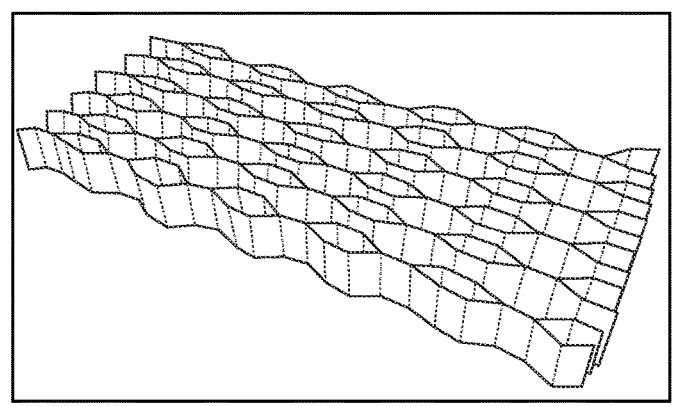

FIGS. 1C and 1D are top and side views, respectively, of the prototype of FIG. 1B as the fold angles are increased. In FIG. 1D, the flat shape of FIG. 1B has popped up out of the plane to create a uniform volume filled with a honeycomb. In this example, abutting faces may then be joined (such as, but not limited to, with glue or any other suitable method or substance) in order to fix the prototype in its three-dimensional form.

Saito's method [Kazuya Saito, Sergio Pellegrino, Taketoshi Nojima, "Manufacture of Arbitrary Cross-Section Composite Honeycomb Cores Based on Origami Techniques", ASME Journal of Mechanical Design, May 2014, Vol. 136; Saito, K., Agnese, F., and Scarpa, F., "A Cellular Kirigami Morphing Wingbox Concept", J. Intell. Mater. Syst. Struct., Vol. 22, 2014, pp. 935-944] generalizes this basic construction to give the honeycomb a shaped cross section. The parameters may be calculated for a folding diagram that extends the above construction to an arbitrary two dimensional extruded shape on top and bottom of the honeycomb. FIGS. 2A-D depict a recreation of Saito's construction of a honeycomb with a sine wave as the top surface, and a parabola as the bottom surface.

Figure 2A:
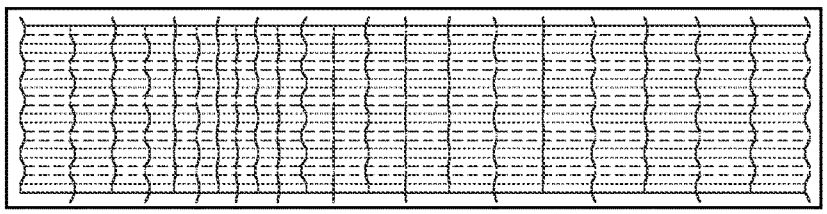
Figure 2B:
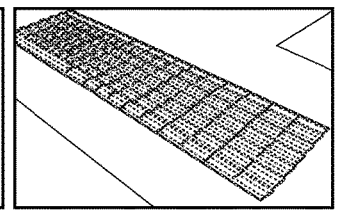

FIG. 2A shows the folding pattern, with the same color conventions as in FIG. 1A. FIG. 2B depicts a paper prototype. The details of the calculated folding diagrams can be found in Kazuya Saito, Sergio Pellegrino, Taketoshi Nojima, "Manufacture of Arbitrary Cross-Section Composite Honeycomb Cores Based on Origami Techniques", ASME Journal of Mechanical Design, May 2014, vol. 136.

Figure 2C:
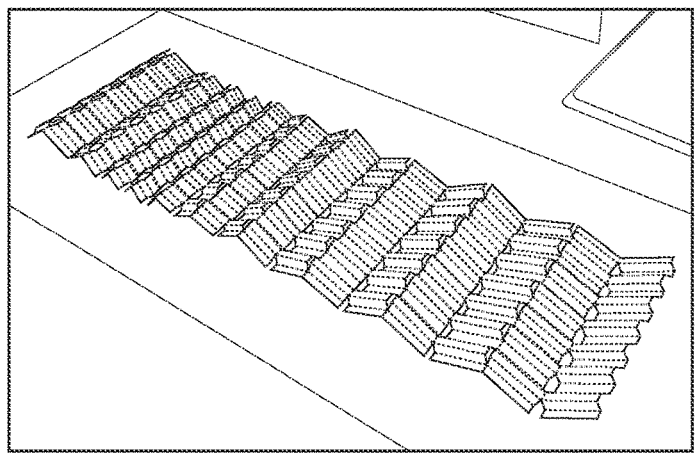
Figure 2D:
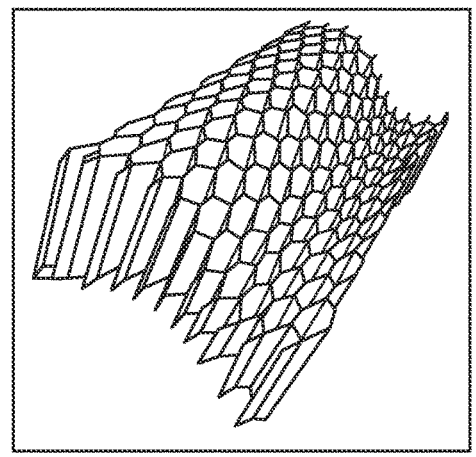

FIGS. 2C and 2D depicts the prototype of FIG. 2B as the fold angles are increased. It can be seen that, as the abutting faces are closed up, a honeycomb possessing the desired profiles for the top and bottom surface (a sine wave on top, and a parabola on bottom) is left. The honeycomb cells are smoothly joined, and the local slope matches a linear approximation to the functions over each cell width.

Applying extensions of the above process, some clarifying conventions are adopted for talking about these constructions. The spatial direction of the cross section (e.g. the variable in the sine function) is called x, the extrusion direction is called y (e.g. coming out of the sine function's page), and the height (e.g. the value of the sine function) is called z. There is a differentiation between two fold types in these constructions: the corrugation-type folds run in the z-direction and project vertically to the vertices of the hexagons. The cross-sectional folds run in the y-direction and project to the edges between adjacent hexagons in the x-direction.

Figure 3A:
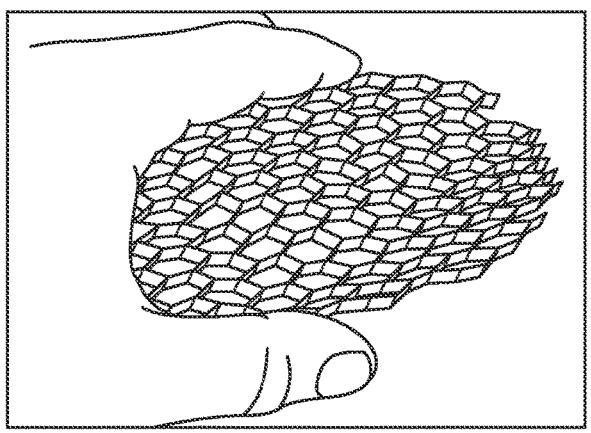
FIGS. 3A and 3B depict an example honeycomb in, respectively, expanded and squashed flat configurations.
Figure 3B:
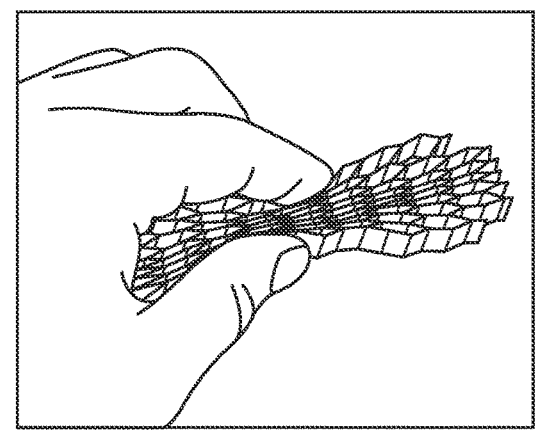

The above constructions all depend on eventual bonding of the honeycomb to a face sheet or skin, as in typical sandwich core construction. Until this happens, the honeycomb itself still has an internal mechanism (squashing flat, as shown in the example honeycomb of FIGS. 3A and 3B) and is not dimensionally stable.

It can be difficult to ensure consistency of this bonding process [Pflug, Jochen, Verpoest, Ignace, Vandepitte, Dirk, "Folded Honeycombs: Fast and continuous production of the core and a reliable core-skin bond", Proc. 12th International Conference on Composite Materials, 1999, p. 109], and it can add significant mass to the sandwich structure produced. Given the granularity of control in these constructions, it is desirable to extend this to constraining and skinning the honeycomb structures. Further, several of the ways to tune three-dimensional shape and material properties rely on the constraints prescribed in this way.

Joinery.

As far as bonding abutting faces together, the honeycombs produced in this fashion can be held in their folded states with a variety of methods.

Figure 4A:
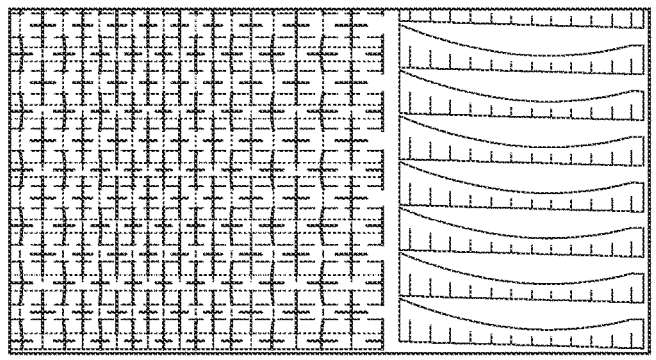
FIGS. 4A and 4B depict a folding pattern and prototype, respectively, of an example honeycomb embodiment wherein slotted cross sections are used to hold the folds closed and evenly space the cell widths.
Figure 4B:
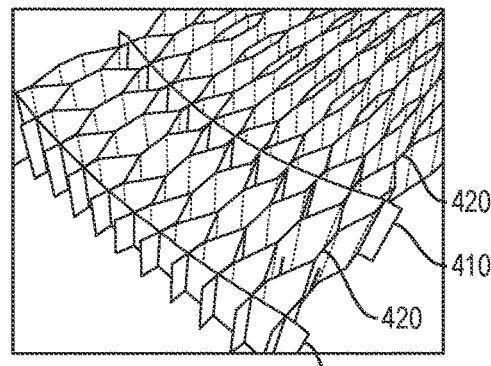

FIGS. 4A and 4B depict a folding pattern and prototype, respectively, of an example honeycomb embodiment wherein slotted cross sections 410 are used to hold the folds closed and evenly space the cell widths. The shape shown in FIGS. 4A and 4B is glued at points 420, but the folds can also be efficiently spot-welded together. In the case of metals, this can be resistance spot welding, while plastics can be joined with a variety of spot welding techniques, including ultrasonic or RF welding. It will be clear to one of skill in the art that many other suitable permanent joining techniques exist, and that the suitability of various techniques will vary and be dependent upon the materials from which the honeycomb is formed.

Reversible methods for fastening the folded honeycombs and holding the desired shape are also suitable for use with the invention. These techniques not only join abutting faces, but can also set the exact width of a honeycomb cell. Reversible techniques also have the advantage that honeycombs may be disassembled, modified, repaired, and reassembled. Also, for applications where reuse and recycling are important, the lack of glue significantly increases the yield of these processes. Four reversible methods for fastening the folded honeycombs and holding the desired shape are described, but it will be clear to one of skill in the art that other such methods exist and are suitable for use with the invention.

In a first reversible method, slotted cross sections, similar to those shown in FIGS. 4A and 4B, are used to hold the folds closed and evenly space the cell widths. This joinery technique requires very little additional material and enforces a cross-sectional curve at each row of cells. Further, this joinery can fully constrain the honeycomb lattice, while leaving significant flexural degrees of freedom. In the "Elastic Properties" section, it is shown how the lengths of these slotted pieces can be tuned to control the flexural modulus of the honeycomb in the y-direction. Further, by choosing in which directions to run the slotted parts, the preferred directions of stiffness and flexure can be controlled.

Figure 5A:
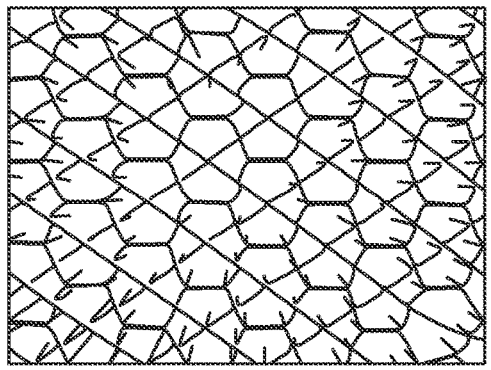
FIGS. 5A and 5B are top and side views, respectively, of an example embodiment of slotted cross section joinery.
Figure 5B:
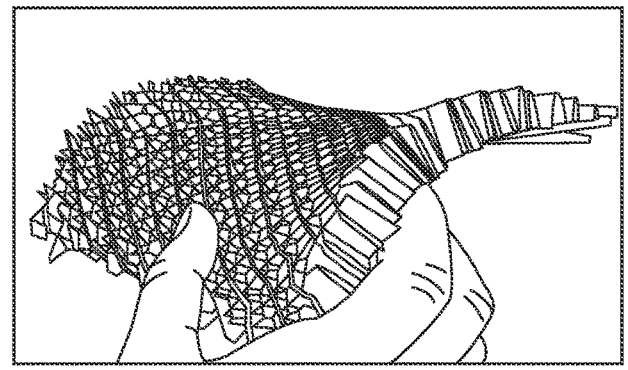

FIGS. 5A and 5B are top and side views, respectively, of an example embodiment of slotted cross section joinery, wherein the slotted joining pieces run at plus and minus approximately 45 degrees to the x-direction, and the preferred directions of flexure are directly aligned with the x- and y-axes.

Figure 6A:
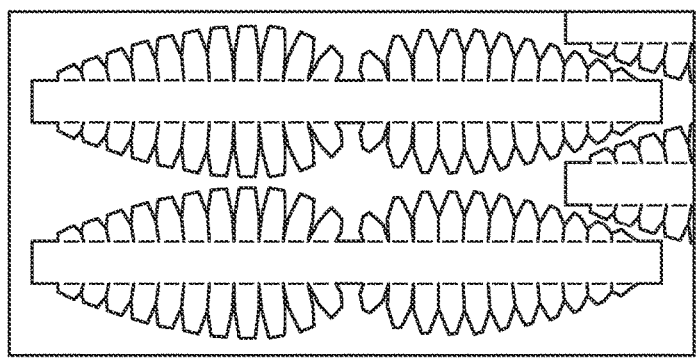
FIGS. 6A and 6B are schematic and prototype renderings, respectively, depicting a strip joinery strategy that employs strips to cover the honeycomb surface with tabs that link into the structure.
Figure 6B:
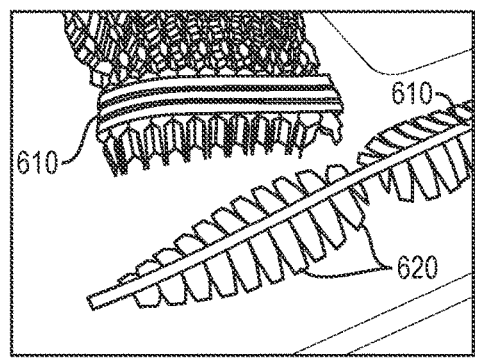
Figure 7A:
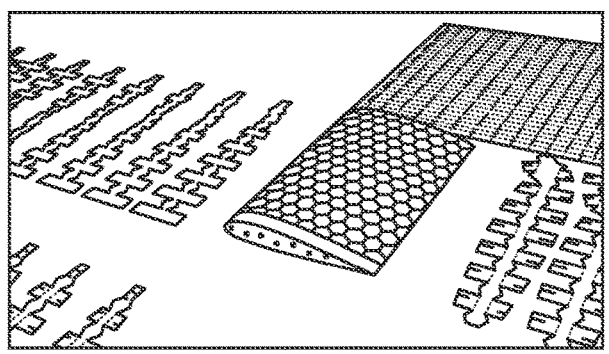
FIGS. 7A-D are four views depicting an example of angled strip joinery.
Figure 7B:
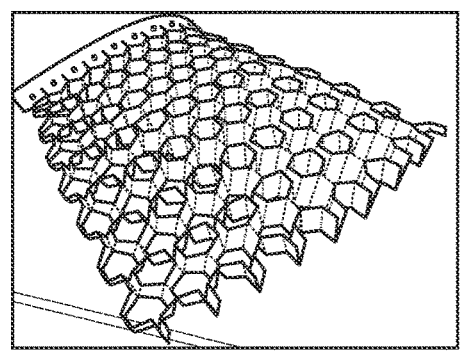
Figure 7C:
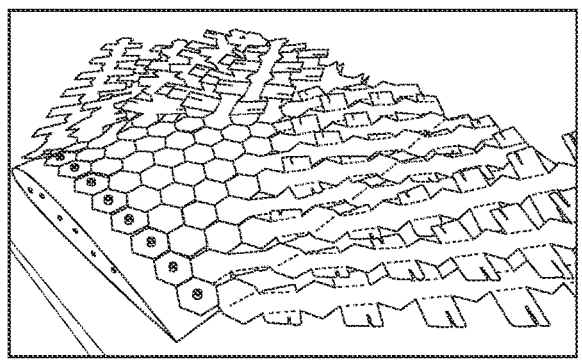
Figure 7D:
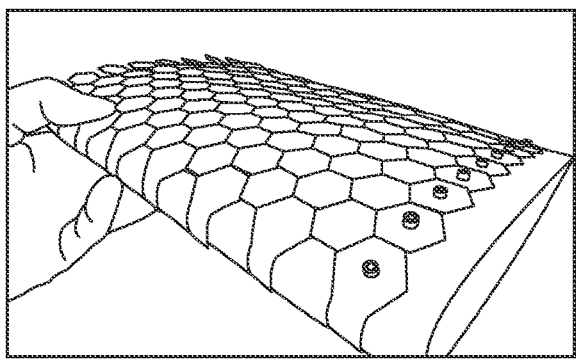

In a second reversible method, strip joinery, tabbed strips cover the honeycomb surface and link to the structure. FIGS. 6A and 6B are schematic and prototype renderings depicting a strip joinery strategy that employs strips 610 that cover the honeycomb surface and have tabs 620 that link into the structure. This significantly stiffens the honeycomb with a load-bearing skin. This also mitigates core-skin delamination, a major failure mode of sandwich construction, by physically linking the two layers. This joinery has the added benefit that it can be used as a final covering, or can easily be covered in a layer of composite material. These strips may run in any of the principle directions of the honeycomb. FIGS. 6A and 6B show strips running in the x-direction.

FIGS. 7A-D are four views depicting an example of angled strip joinery. Seen in FIGS. 7A-D are two sets of strips running at 60 degrees with each other (and 30 degrees with the x-axis). These strips weave to create a quasi-isotropic load-bearing skin interdigitated with the core.

Figures 8A, 8B:
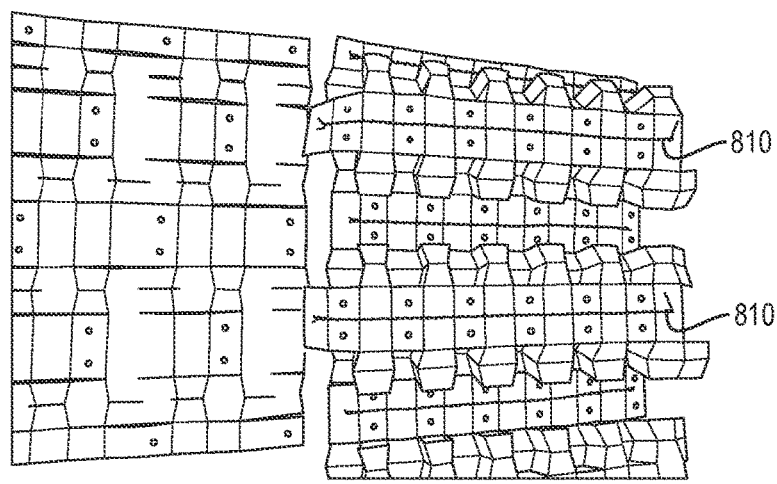
FIGS. 8A and 8B are flat and folded views, respectively, of an example of sewn joinery.
Figure 9:
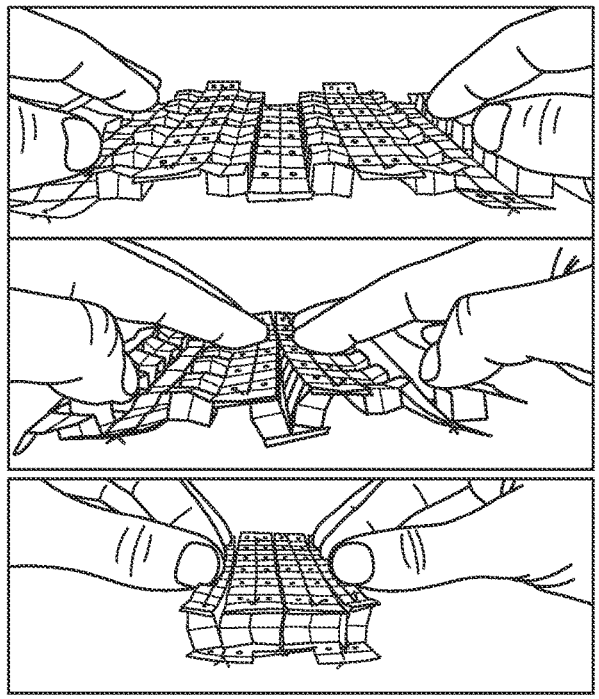
FIG. 9 depicts the process of further folding the example of FIGS. 8A-B to create the honeycomb geometry.

In a third reversible joinery method, sewn joinery, honeycombs with integral skins can be made such that each cell has a small flap that when folded covers the adjacent cell on top and bottom. One version of this is shown in FIGS. 8A and 8B, which are are flat and folded views, respectively, of an example of sewn joinery. The two-dimensional cut pattern of FIG. 8A is described by columns that alternate between regions that will transform into the honeycomb core and regions that will transform into the honeycomb skin. To satisfy the honeycomb geometry, it is then necessary to establish a length difference between adjacent columns. Pflug's method outlines a way to do this with thermoplastic stamping, but more reliable geometries can be created more efficiently by folding pleats to make up the extra length. FIG. 8B shows the pleats sewn down 810 via a simple machine process. FIG. 9 depicts the process of further folding the example of FIGS. 8A-B. The columns are folded up and down along the cross-sectional folds in order to create the honeycomb geometry.

Figure 10A:
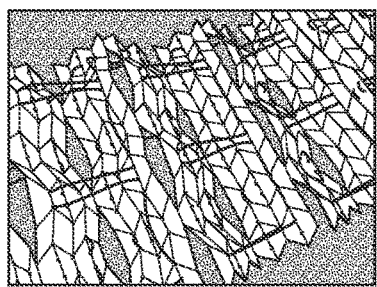
FIGS. 10A-C are three views depicting an example of laced joinery.
Figure 10B:
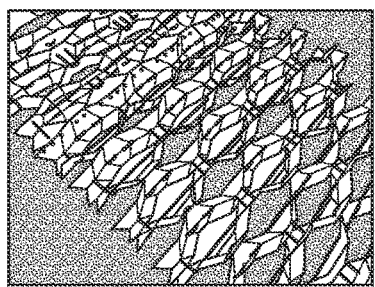
Figure 10C:
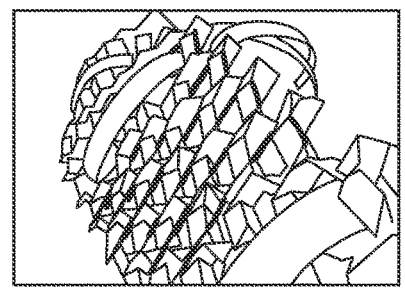

In a fourth reversible joinery method, laced joinery, two dimensional patterns can be given lacing holes through automated cutting or punching processes. These holes can then be threaded with a cord or line while the pattern is still flat. As the pattern is folded, the slack is removed from the cord or line until adjoining faces are held fast. FIGS. 10A-C are three views depicting an example of laced joinery.

Complex 3D Geometry.

Figure 11A:
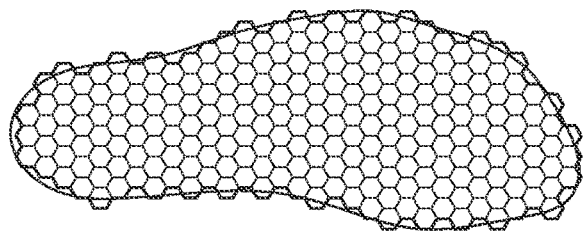
FIGS. 11A-B depict, respectively, an example honeycomb trimmed into a shoe shape and a computer-generated three-dimensional shoe-shaped honeycomb.
Figure 11B:
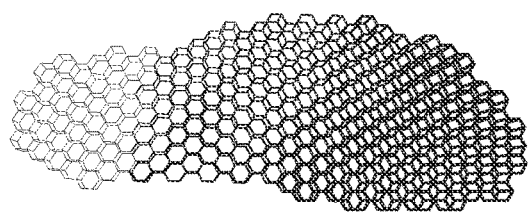

The basic construction techniques can be extended and generalized in several ways. First, the folding diagram can be adjusted to include or exclude cells so that the vertical projection creates a desired shape. FIGS. 11A-B depict, respectively, an example honeycomb trimmed into a shoe shape and a computer-generated three-dimensional shoe-shaped honeycomb. To do this, the desired shape is parameterized by a list of points, and a point-in-polygon ray casting test is performed for the center of each honeycomb cell. Then, taking the left-most cell as a starting point, the boundary can be efficiently walked with a move look-up table. This identifies the boundary cells. To make sure the boundary cells effectively close, a set of rules are applied to the folding diagram about which faces to trim, and whether to apply edge-case joinery.

Figure 12A:
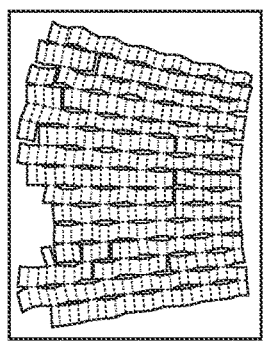
FIGS. 12A and 12B depict top and side views, respectively, of an example honeycomb embodiment with a constant height construction, but having a conformal mapping applied to the folding diagram.
Figure 12B:
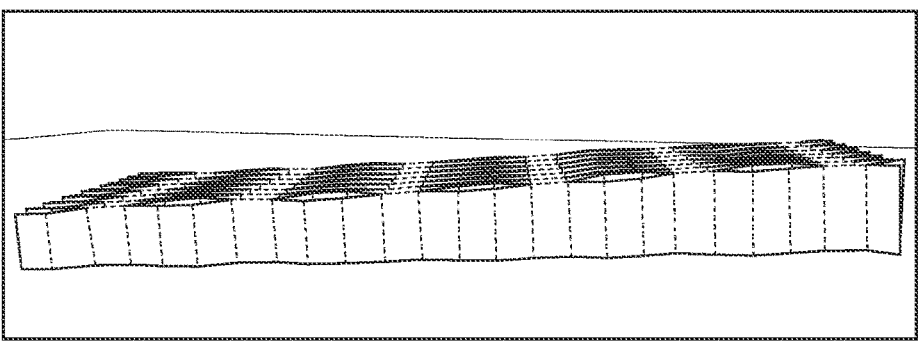

The next simplest extension of the honeycomb construction is to have a constant linear taper along the direction of extrusion of the cross section. FIGS. 12A and 12B depict top and side views, respectively, of an example honeycomb embodiment with a constant height construction, but having a conformal mapping applied to the folding diagram. This has the effect of making the z value at one end smaller than at the other, while preserving the angle made between each cross-sectional fold and the incoming and outgoing corrugation fold. This condition is necessary for the honeycomb faces to match up when folded. The conformal mapping chosen that satisfies this property is a polar "wrapping", where lines of one direction map to radial lines, and lines of the other direction map to concentric arcs. The minimum radius of the arcs determines the slope of the linear taper.

Figure 13A:
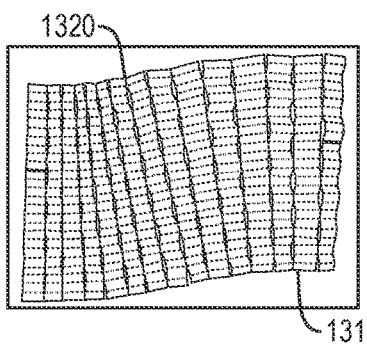
FIGS. 13A-C are three views depicting an example honeycomb that transitions from a constant thickness at one end to a thickness that varies as a sine wave at the other end.
Figure 13B:
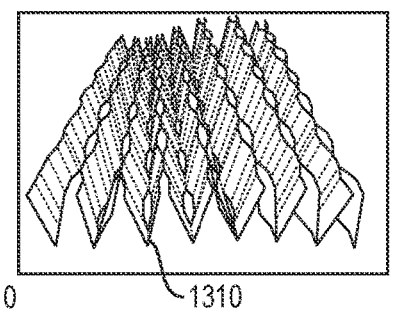
Figure 13C:
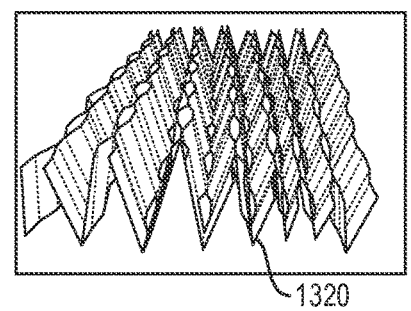

This type of mapping can be used for non-constant tapers as well. For instance, a slope can be specified not just globally, but at each point in the cross section (i.e., at each value of x). To do this, the radius of the polar wrapping is defined as a function of x. FIGS. 13A-C are three views depicting an example honeycomb that transitions from a constant thickness at one end to a thickness that varies as a sine wave at the other end. FIG. 13A shows the folding diagram. In FIG. 13A, the cross-sectional folds are at even intervals along the bottom edge 1310. This corresponds to FIG. 13B, where the folded honeycomb is seen to have a constant thickness. At the top edge 1320 of the flattened diagram of FIG. 13A, however, the corrugation folds are bunched at first, then spread out, which corresponds to the variable thicknesses at the other end of the honeycomb, seen in FIG. 13C.

Putting these basic effects together, functional shapes can be created, such as the example pictured in FIGS. 14A-C, which are top side and end views, respectively, of an example functional shape, a shoe sole, which has a variable thickness. The example shoe sole exhibits a trimmed shape (specified by the outline of a foot), a cupped surface on top, an angled surface on bottom, and a linear taper from back to front.

If slightly more complexity is introduced into the folding diagrams, completely arbitrary three-dimensional surfaces may be produced with this construction. This is done by adding an extra pleat in the folding diagram. FIGS. 15A and 15B depict a set of irregular honeycomb coordinates and a generic folding pattern, respectively, which parameterize the honeycomb and folding diagram for an example volume-filling honeycomb.

The mathematical details of this type of construction are as follows: To construct a volume-filling honeycomb, start with two functions $t(x,y)$ and $u(x,y)$, giving the height of the top and bottom of the honeycomb respectively for each x and y value. Use a set of irregular honeycomb coordinates to evaluate these functions, as depicted in FIG. 15A. The shorthand $t(i,j)$ and $u(i,j)$ is used to denote the functions evaluated at the honeycomb coordinates. A generic folding pattern is shown in FIG. 15B. When folded, the line from $A(0,0)$ to $B(0,0)$ runs out of the page at coordinate $(0, 0)$, while the line from $C(0,0)$ to $D(0,0)$ runs into the page at coordinate $(2,0)$. The task is to calculate the folding diagram parameters in terms of the function values at the honeycomb coordinates. To do this, first calculate unshifted parameters $A'(i,j)$, $B'(i,j)$, $C'(i,j)$, and $D'(i,j)$ which give the folding diagram parameters through the column shifts:

$$A_{i,j}=A'_{i,j}+W_i$$

$$B_{i,j}=B'_{i,j}+W_i$$

$$C_{i,j} = C'_{i,j} + V_i$$

$$D_{i,j} = D'_{i,j} + V_i$$

Studying the correspondence between the figures above shows:

$$A'_{i,j} = \begin{cases} u(4i, j) & \text{if } j \equiv 0 \text{ or } j \equiv 1 \\ u(4i+1, j) & \text{if } j \equiv 2 \text{ or } j \equiv 3 \end{cases} \pmod 4$$

$$B'_{i,j} = \begin{cases} t(4i, j) & \text{if } j \equiv 0 \text{ or } j \equiv 1 \\ t(4i+1, j) & \text{if } j \equiv 2 \text{ or } j \equiv 3 \end{cases} \pmod 4$$

Similarly, write formulas for C'(i,j) and D'(i,j) recursively:

$$C'_{i,j} = \begin{cases} C'_{i,j-1} - t(4i+2, j) + t(4i+1, j-1) & \text{if } j \equiv 0 \\ C'_{i,j-1} - t(4i+2, j) + t(4i+2, j-1) & \text{if } j \equiv 1 \\ C'_{i,j-1} - t(4i+1, j) + t(4i+2, j-1) & \text{if } j \equiv 2 \\ C'_{i,j-1} - t(4i+1, j) + t(4i+1, j-1) & \text{if } j \equiv 3 \end{cases} \pmod 4$$

Set D'(i,0)=C'(i,0)+t(4i+2,0)−u(4i+2,0) and recurse similarly:

$$D'_{i,j} = \begin{cases} D'_{i,j-1} - u(4i+2, j) + u(4i+1, j-1)) & \text{if } j \equiv 0 \\ D'_{i,j-1} - u(4i+2, j) + u(4i+2, j-1)) & \text{if } j \equiv 1 \\ D'_{i,j-1} - u(4i+1, j) + u(4i+2, j-1)) & \text{if } j \equiv 2 \\ D'_{i,j-1} - u(4i+1, j) + u(4i+1, j-1)) & \text{if } j \equiv 3 \end{cases} \pmod 4$$

Finally, calculate the offset parameters:

$$V_i = \max_j (B'_{i,j} - C'_{i,j}) \quad W_i = \max_j (D'_{i,j} - A'_{i,j+1})$$

The calculated offset parameters have the effect of shifting successive strips to avoid intersections. Importantly, these formulas simplify to the constructions for constant cross sections and ruled surfaces described above. Furthermore, the addition of this pleat allows the corrugation folds to remain straight and parallel to each other. This has great benefits for manufacturability.

An example application of a volume-filling honeycomb shape developed using this methodology is shown in FIGS. 16A and 16B, which depict a plan view of an example wind turbine blade shape (FIG. 16A), along with its pleated folding diagram (FIG. 16B).

Bends and Twists.

For more exotic three-dimensional honeycombs, one can specify partially closed cross-sectional folds, instead of fully closing every one. If properly constrained, this can give bends and twists in the overall structure. Specifying these degrees of freedom in the direction of the cross section (a curve in the x-direction) is relatively easy. This may be accomplished by modifying the features of the joinery to not fully close some of the cross-sectional folds. For instance, the camber of a wing may be modified in this way. This modification has ability to modify curvature of the honeycomb mid-surface in the x-direction while leaving the curvature in the y-direction unchanged.

Figure 17A:
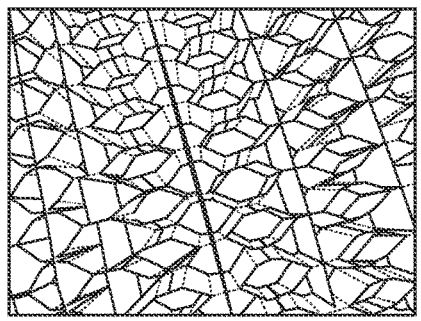
FIGS. 17A and 17B are top and side views, respectively, of an example embodiment of a honeycomb with only the valley folds held closed and exhibiting an upward bend.
Figure 17B:
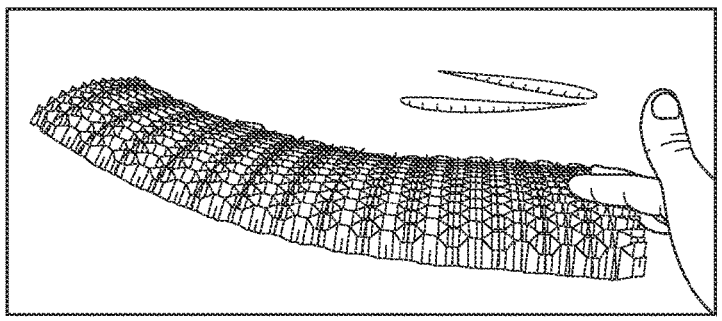

Producing bends and twists in the y-direction is also possible. If, instead of simply hinging around the cross-sectional folds as above, the hexagonal cells are selectively flattened, different lengths can be produced along the top and bottom of the honeycomb, resulting in bending behavior along the y-direction. FIGS. 17A and 17B are top and side views, respectively, of an example embodiment of a honeycomb with only the valley folds held closed, which exhibits an upward bend, as the honeycomb cells along the bottom remain stretched. If the joinery holds matching honeycomb faces flush, this strategy produces anticlastic honeycomb curvature (i.e. producing positive curvature in the y-direction while producing negative curvature in the x-direction). If the joinery holds matching honeycomb faces apart, this strategy can modify curvature in the y direction while leaving curvature in the x-direction unchanged. This can be conceptualized as a combination of the two aforementioned curvature strategies.

Figure 18A:
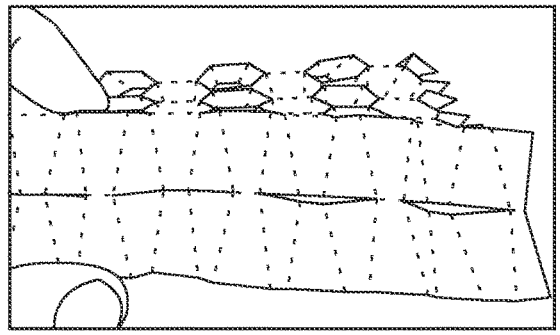
FIGS. 18A and 18B are side and top views, respectively, of an example embodiment having canted corrugation lines.
Figure 18B:
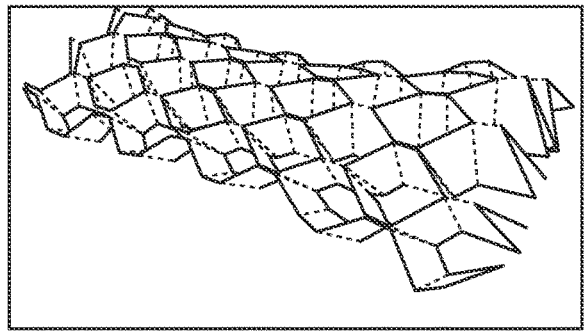

Another strategy for producing anticlastic honeycomb mid-surface curvature is the canting of corrugation lines in each cell. This is shown in FIGS. 18A-B, which are side and top views, respectively, of an example embodiment having canted corrugation lines. When folded as in the standard kirigami construction, the corresponding honeycomb mid-surface has an anticlastic curvature, the magnitude of which is a monotonic function of the canting angle. This strategy may be combined with the above curvature strategies to produce prescribed curvatures in each of the x- and y-directions.

This insight can be used to programmatically control the closure angle of folds on top and bottom in order to produce desired bends. For instance, an airfoil section may be given an upward slant at its end to create the aerodynamically-efficient winglet. Similarly, by differentially closing folds on top and bottom on leading and trailing edges, a twist along the length of a honeycomb can be created. This may be used, for instance, for a turbine blade, where the airfoil cross section is twisted in order to maintain a constant angle of attack along the blade length.

Figure 19:
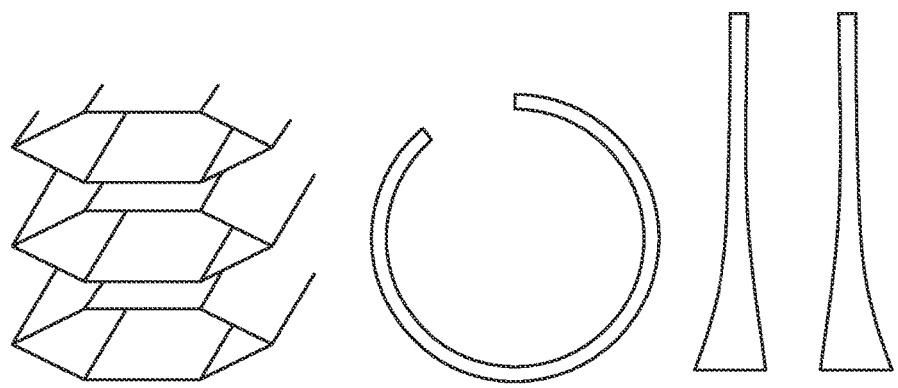
FIG. 19 illustrates an example embodiment using bends to create topologies besides flat slabs, wrapping a uniform slab into a cylinder.

Further, these bends can be used to create topologies besides flat slabs. FIG. 19 illustrates an example embodiment using the method above to wrap a uniform slab into a cylinder. An arbitrary wall profile can then be specified for the cylinder, thinning and thickening the walls and/or opening and narrowing the diameter. To join seams for such a cylinder or more complicated shape, a variety of schemes may be used, including, but not limited to, a progressive offset of the seam, similar to the construction of spiral-seam pipes and ducts.

Elastic Properties.

Figure 20A:
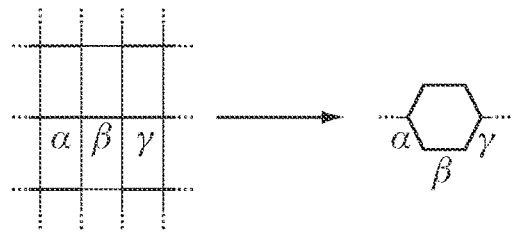
FIGS. 20A and 20B depict two example embodiments that illustrate how varying the lengths alpha, beta, gamma shown can create honeycomb cells with a range of included angles.
Figure 20B:
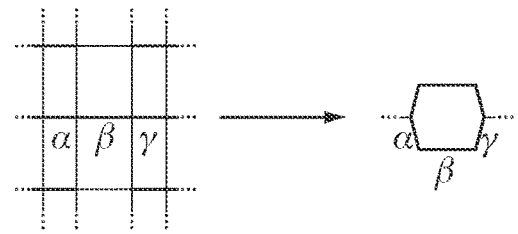

Using any of the forms of cross bracing, the honeycomb angle may be specified by holding cell width constant and changing the honeycomb side length. FIGS. 20A and 20B depict two example embodiments that illustrate how varying the lengths alpha, beta, gamma shown can create honeycomb cells with a range of included angles.

Figure 21A:
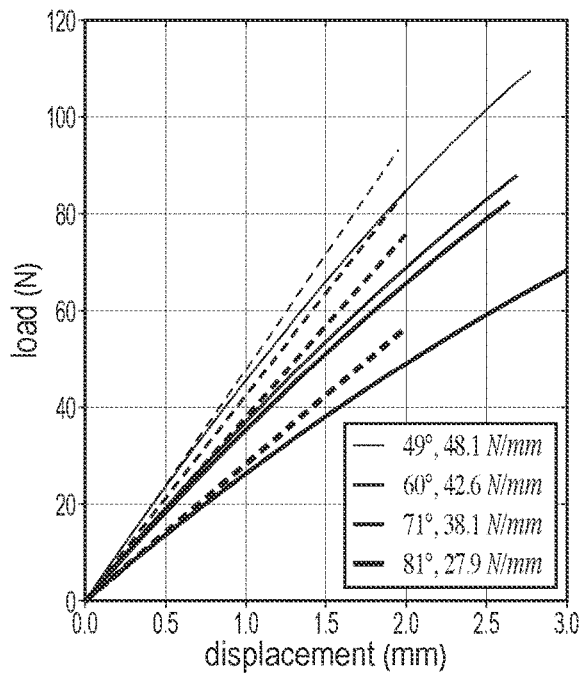
FIGS. 21A and 21B depict the honeycomb angle v. flexural stiffness results of a three-point bend test of 3-dimensional printed honeycombs.
Figure 21B:
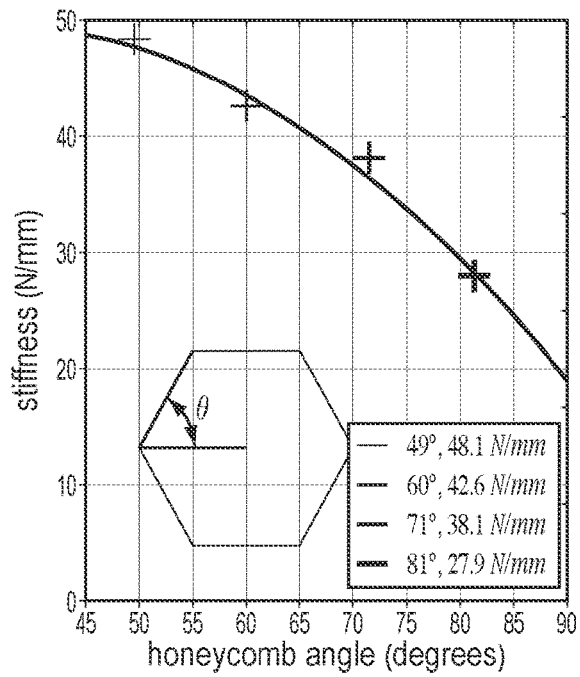

Flexural stiffness is strongly dependent on honeycomb angle. FIGS. 21A and 21B depict the honeycomb angle v. flexural stiffness results of a three-point bend test with 3D printed honeycombs. A simple second order fit to the data shows that increasing the honeycomb angle creates more flexibility. Alternatively, or in addition, corrugation folds may be replaced with zig-zag folds in order to produce a prescribed stiffness in the direction of the honeycomb's thickness.

Further methods can be used to control other elastic properties of these honeycombs. Pflug and Neirinck [PCT Pat. App. Pub. No. WO2008141688, Jochen Pflug, Wouter Neirinck, "Elastic honeycomb sheet, its production process and equipment to produce", 2008] suggest a thermoforming approach for the production of flat, uniform honeycombs with tunable elastic stiffness in the z-direction. These same techniques can be applied to three-dimensional honeycombs because they start out flat.

Figure 22A:
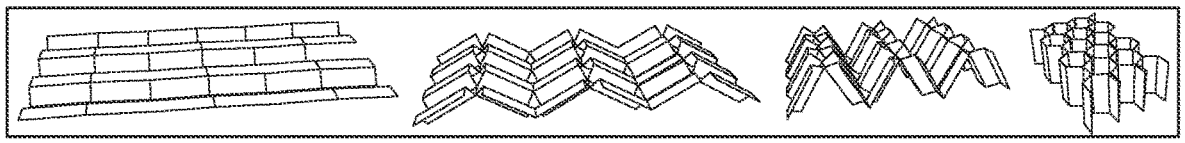
FIGS. 22A and 22B illustrate replacing straight corrugation folds (FIG. 22A) with zig-zag folds (FIG. 22B) in order to achieve tunable z-stiffness.
Figure 22B:
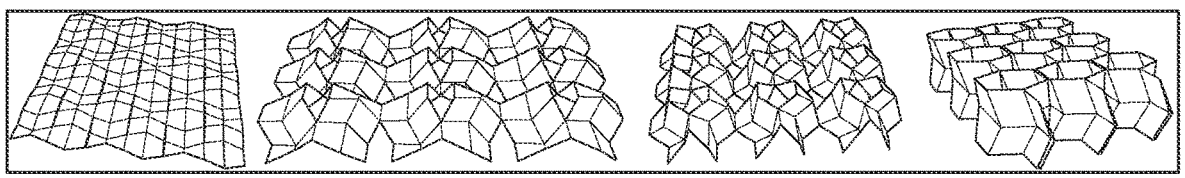

In addition, tunable elastic stiffness in the z-direction can also be achieved using only two-dimensional cutting and folding geometry, if the straight corrugation fold lines from the standard construction are replaced with zig-zag folds. FIGS. 22A and 22B illustrate replacing straight corrugation folds (FIG. 22A) with zig-zag folds (FIG. 22B) in order to achieve tunable z-stiffness. If the zig-zag folds are made with a constant angle (which is denoted alpha) relative to the mean line, they produce a modified Miura-Ori folding pattern of parallelograms and trapezoids. The resulting kirigami honeycomb, in its mathematical idealization, has a rigid flat folding mechanism in the z-direction if alpha is greater than zero.

Figure 23A:
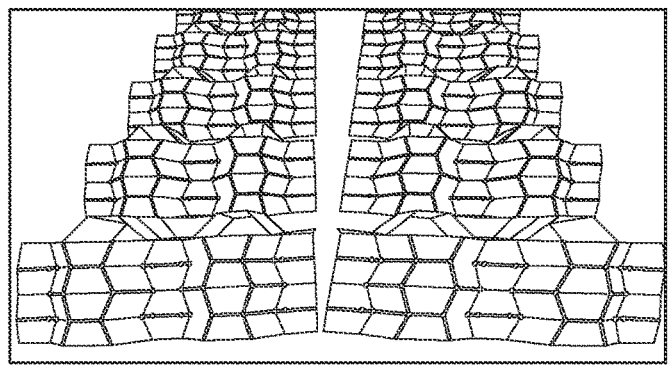
FIGS. 23A and 23B depict several example embodiments with zig-zag folds of variable angle alpha.
Figure 23B:
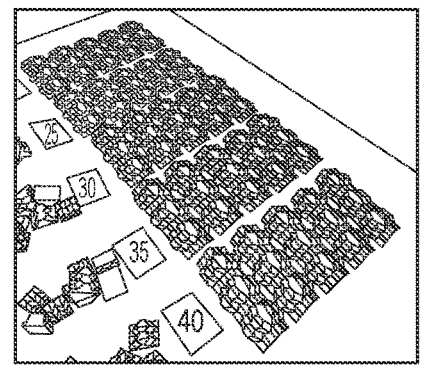
Figure 24:
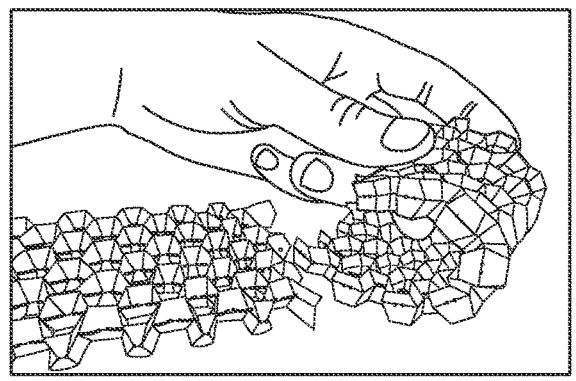
FIG. 24 depicts example test specimens having zig-zag folds.
Figure 25:
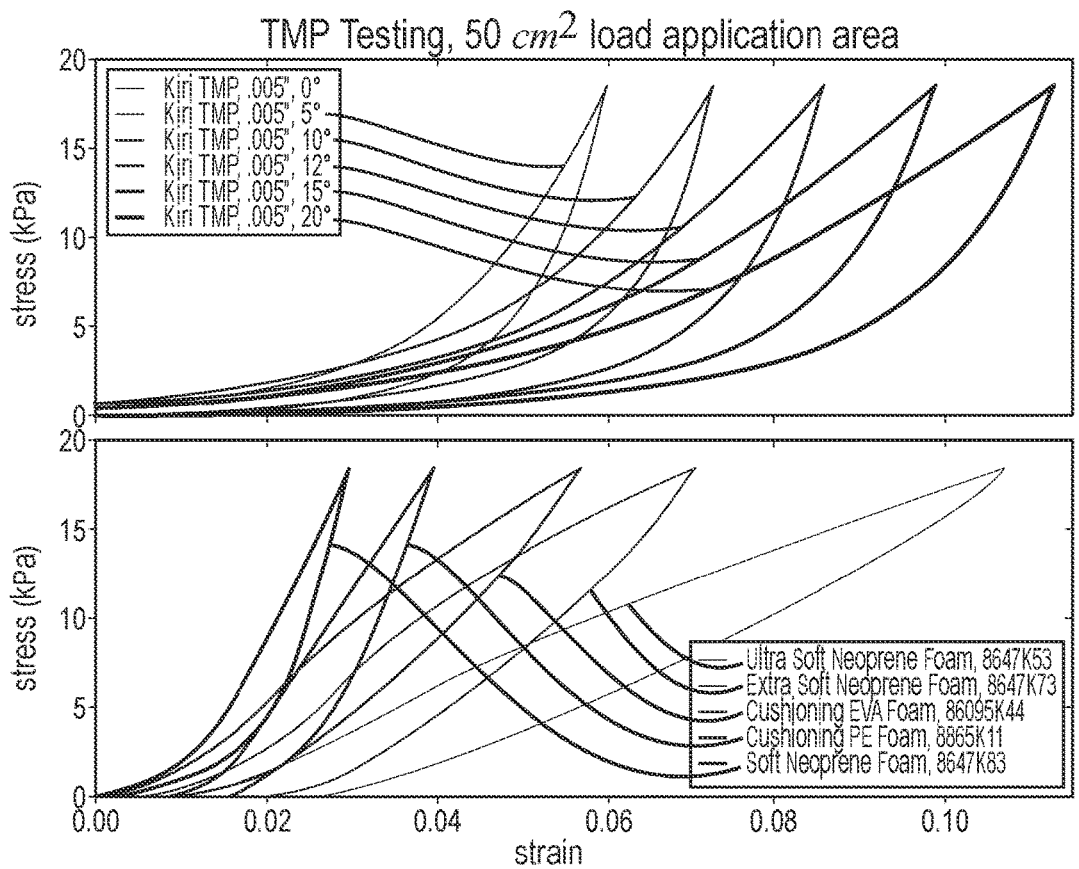
FIG. 25 depicts loading results from tests performed on the zig-zag fold specimens similar to those of FIGS. 23A, 23B, and 24.

In physical applications, boundary condition constraint and hinge stiffness make this mechanism an elastic degree of freedom. Further, the choice of angle alpha sets the magnitude of this elastic stiffness. FIGS. 23A, 23B, and 24 depict several example embodiments with zig-zag folds of variable angle alpha, spanning angles from 20 degrees to 40 degrees, though angles outside this range are easily achievable. FIG. 25 depicts loading curves from tests performed on similar specimens to those of FIGS. 23A, 23B, and 24. Comparing the curves, similar behavior to several commercially available foams of comparable density is seen, the spectrum of which is spanned by changing only the angle alpha.

Figure 26:
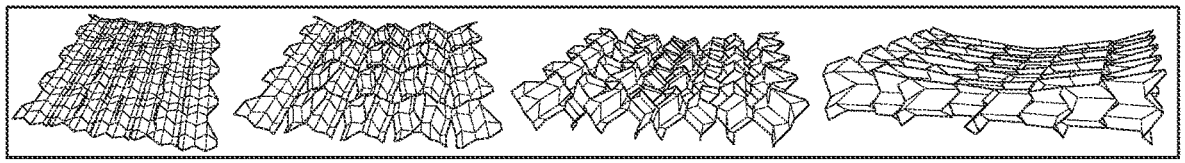
FIG. 26 depicts a kirigami honeycomb with cupped cross section realized using zig-zag construction.
Figures 27A, 27B, 27C:
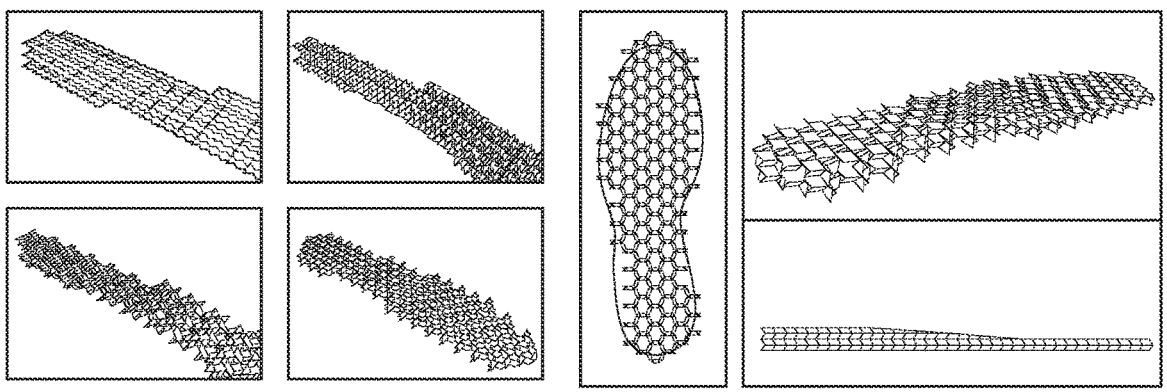
FIGS. 27A-C depict, respectively, folding steps, pattern geometry, and top and side views of an example shoe sole design.
Figure 28A:
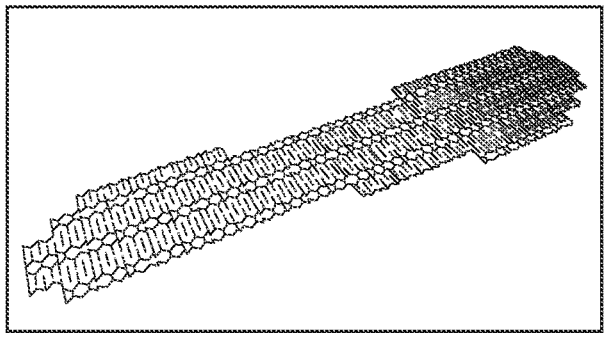
Figure 28B:
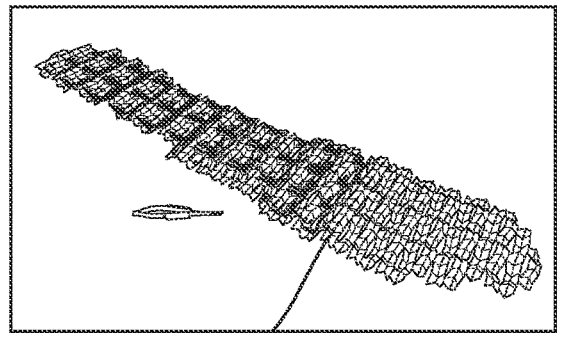
Figure 29A:
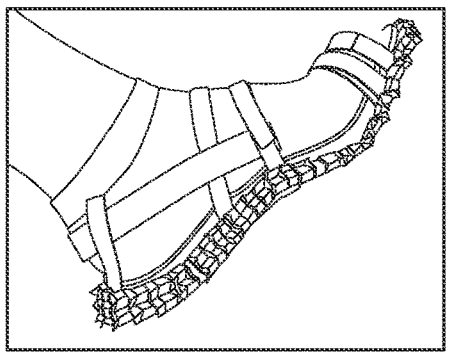
FIGS. 29A and 29B depict the finished example shoe sole prototype of FIGS. 28A and 28B with a foot and during use, respectively.
Figure 29B:
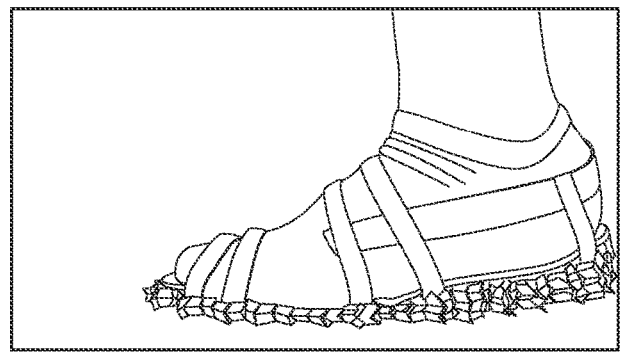

Zig-zag kirigami honeycombs can have the same freedom of geometry as described previously for other constructions. FIG. 26 depicts a kirigami honeycomb with cupped cross section realized using zig-zag construction. FIGS. 27A-C depict, respectively, folding steps, pattern geometry, and top and side views of an example shoe sole design. The shoe sole of FIGS. 27A-C is produced with a specified stiffness and geometry to produce comfortable fit and performance. FIGS. 28A and 28B depict construction of an example shoe sole prototype according to the design of FIGS. 27A-C. FIG. 28A depicts the flat, laser-cut material and FIG. 28B depicts the material after folding and stitching. FIGS. 29A and 29B depict the finished example shoe sole prototype, with a foot (FIG. 29A) and during use (FIG. 29B). Zig-zag kirigami honeycombs can vary the angle alpha over the extent of a single part in order to spatially resolve stiffness in the z-direction.

Manufacturing.

Figure 30:
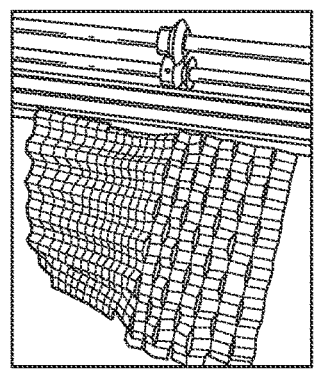
FIG. 30 depicts the process of folding of an example prototype with the aid of a bead roller.

Many of the prototypes described were fabricated on a $CO_2$ laser and folded with the aid of a bead roller, as shown for the example prototype in FIG. 30. Staged rollers of this type can be used to continuously manufacture complex folded sheets, as shown in E. A. Elsayed and Basily B. Basily, "A Continuous Folding Process for Sheet Materials", International Journal of Materials and Product Technology, Vol. 21, 1-3, pp. 217-238, 2004 and E. A. Elsayed and Basily B. Basily, "Applications of Folding Flat Sheets of Materials into 3-D Intricate Engineering Designs", Proceedings of 2003 the NSF Design, Service and Manufacturing Grantees and Research Conference, 2003. This is one option for scaling up production of these three-dimensional honeycombs.

Bead or corrugation rollers may also be integrated with a roll-feed laser or knife cutting machine to produce cuts and folds in a single step. As the corrugation folds are relatively simple, parallel, extended lines that make up the bulk of the folding tasks for the above constructions, much of this could be easily automated. Corrugation is a continuous, high-throughput manufacturing operation, with well understood process parameters. Also, because thick honeycomb sections are created by folding thin materials, the required laser power for such a machine could be relatively low, leading to an inexpensive machine and fast rates of production. Other options besides laser cutting include, but are not limited to, drag knife cutting and ultrasonic cutting. Both have the added advantage of cutting materials that do not respond well to lasers (such as, for example, composite pre-preg, some thermoplastics, PVC, TPUs).

Figure 31A:
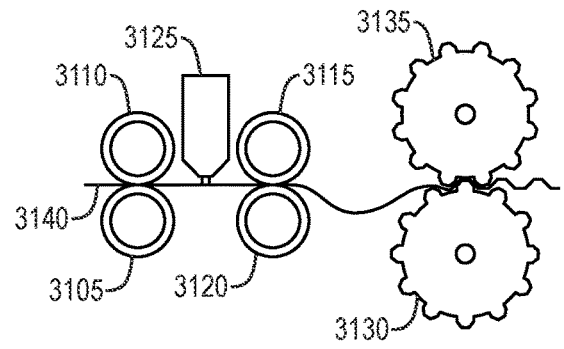
FIGS. 31A and 31B are schematics of two example machines useable for creating corrugation folds for honeycombs, according to one aspect of the methodology of the invention.
Figure 31B:
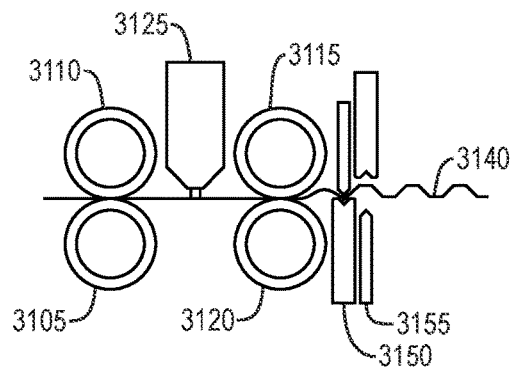

FIGS. 31A and 31B are schematics of two example machines useable for creating corrugation folds for honeycombs. Shown in FIG. 31A are feed rollers 3105, 3110, 3115, 3120, CNC knife or laser 3125, corrugation rollers 3130, 3135, and substrate material 3140. FIG. 31B is a schematic of a similar machine that uses sequential creasing dies 3150, 3155 (press brake dies in sequence) to crease the folding patterns. Such folds may also be made by pressing a corrugation wheel or tip into the media with a compliant backing, producing highly local plastic deformation.

Figure 32:
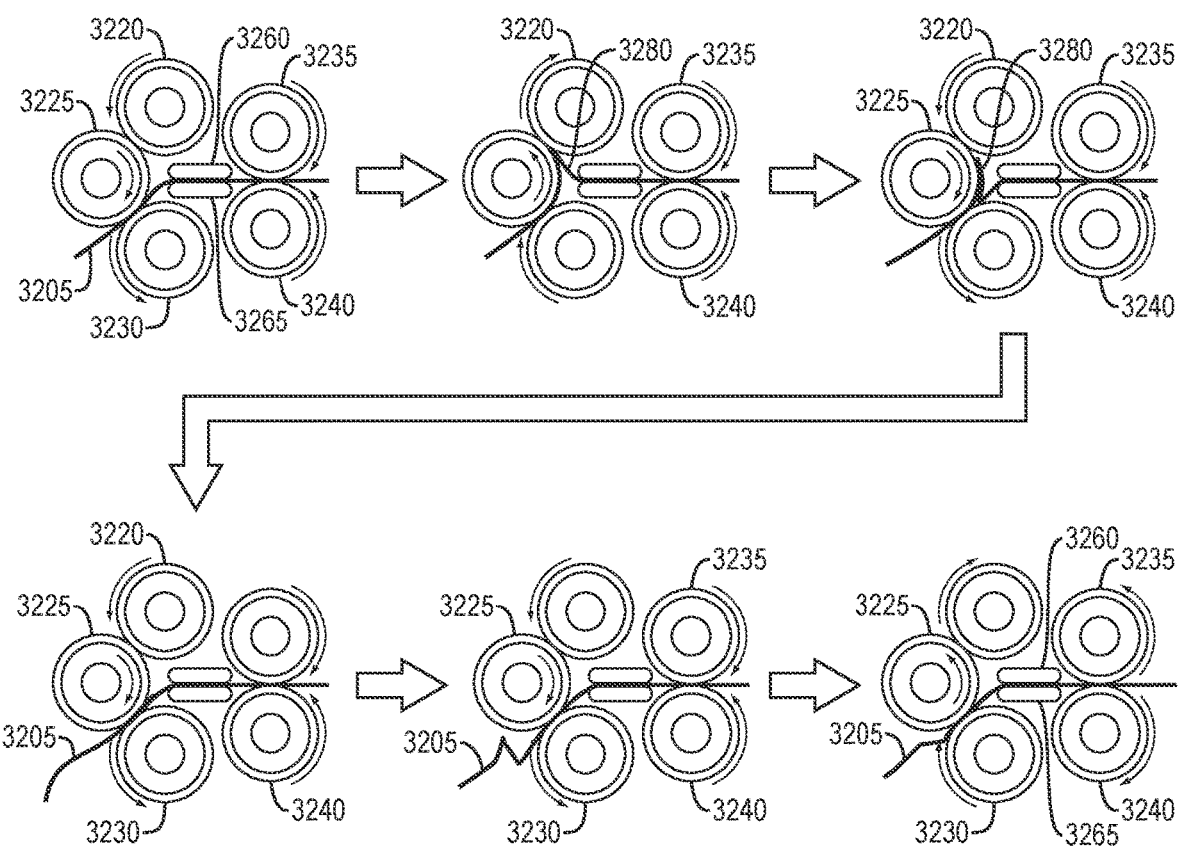
FIG. 32 depicts the operation of a buckle folder, which is an example alternative machine for creating corrugation folds.

Another way of performing the corrugation folds is with a more novel machine, called the buckle folder. FIG. 32 depicts the operation of a buckle folder, which is an example alternative machine for creating corrugation folds. In FIG. 32, a pair of complementary (mountain and valley) folds are placed a specified distance along a piece of sheet material 3205. The arrows indicate the direction of rotation of rollers 3220, 3225, 3230, 3235, 3240. Guides 3260, 3265 control the location of buckle formation and ensure the buckle is grabbed by the appropriate rollers. The rollers 3220, 3225, 3230, 3235, 3240 work together to make mountain and valley folds.

Buckle folder corrugation steps. First, sheet 3205 is drawn into the machine, as the front 3220, 3225, 3230 and rear 3235, 3240 rollers move in the same direction. Next, the front rollers 3220, 3225, 3230 reverse direction, causing a buckle 3280 to form in the sheet. This buckle 3280 is drawn into the feed of the front rollers 3220, 3225, 3230 and is strongly creased in the mountain orientation. Depending on the programmed folding pattern, one might then create a valley fold. In this case, one can continue feeding to create a downward buckle, which is then grabbed by the bottom rollers 3230, 3240 and creased. These two folds can then be fed out of the machine and then the next folds can be placed.

Figure 33:
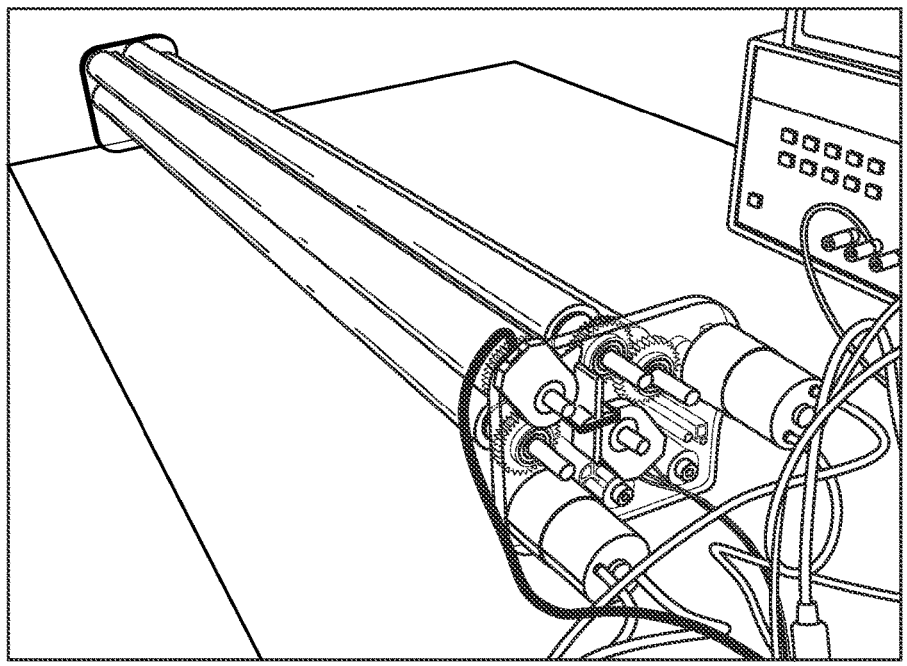
FIG. 33 depicts a prototype embodiment of a buckle folder according to FIG. 32.

FIG. 33 depicts a prototype embodiment of a buckle folder according to FIG. 32. A pair of geared DC motors drives the roller pairs. Capacitive encoders are attached to the roller shafts to perform closed loop control. The motors are driven using a force-controlled PID loop on position by sensing the current flowing through the drivers. The guides are a pair of extruded aluminum "tee" profiles, shimmed apart to allow the sheet material to pass between them.

Figure 34:
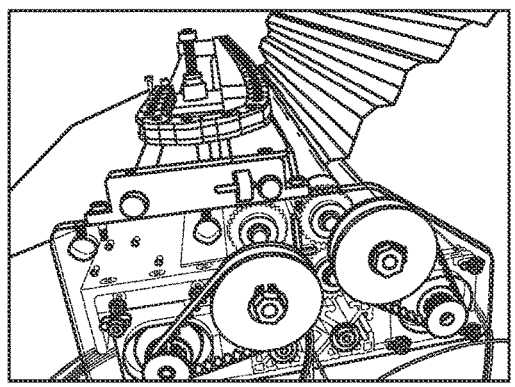
FIGS. 34 and 35 depict an alternate embodiment of a buckle folder using stepper motors and timing belts, with an integrated voice coil cutting stage.
Figure 35:
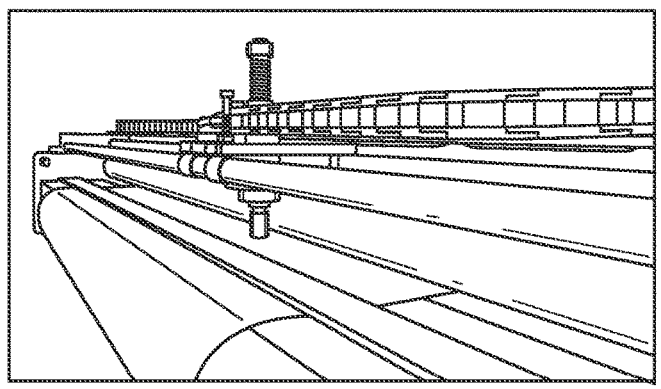

FIGS. 34 and 35 depict an alternate embodiment of a buckle folder, where stepper motors are used with timing belts. This version also includes an integrated cutting stage with a drag knife that traverses the width with vertical stroke driven by a small voice coil.

Figure 36A:
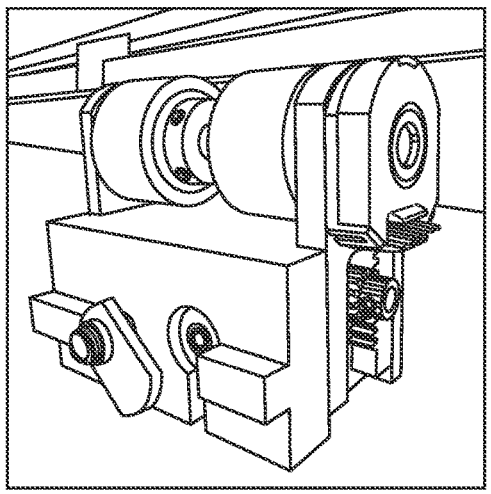
FIGS. 36A and 36B depict example modular rollers (FIG. 36A) for an example buckle folding system (FIG. 36B).
Figure 36B:
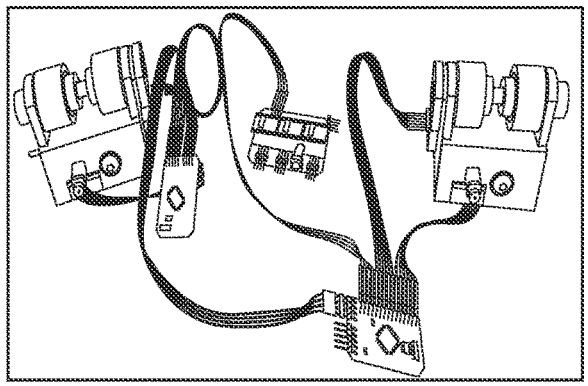
Figure 37A:
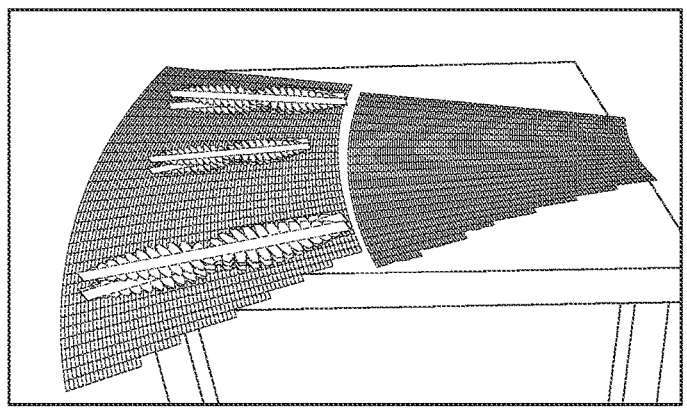
FIGS. 37A-E depict steps in the construction of an example prototype of a wind turbine blade specified by chord length, airfoil shape, and twist as a function of distance along the wing, folded from a flat sheet.
Figure 37B:
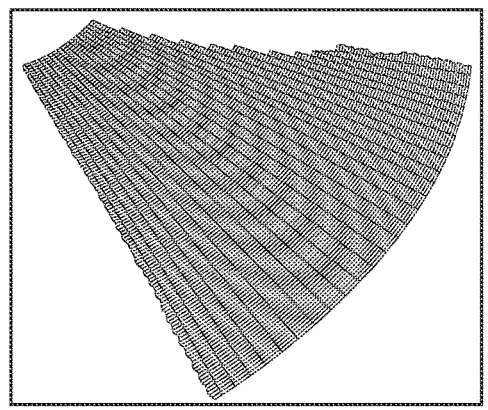
Figure 37C:
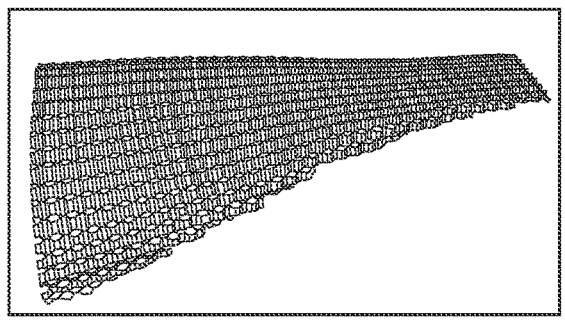
Figure 37D:
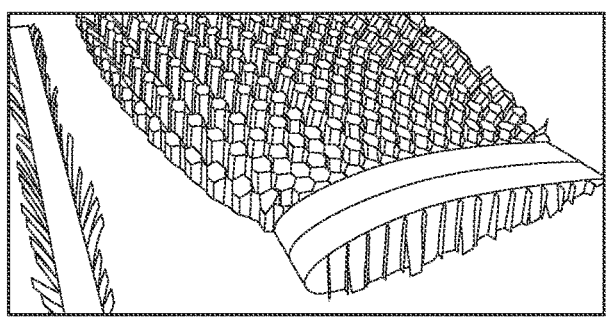
Figure 37E:
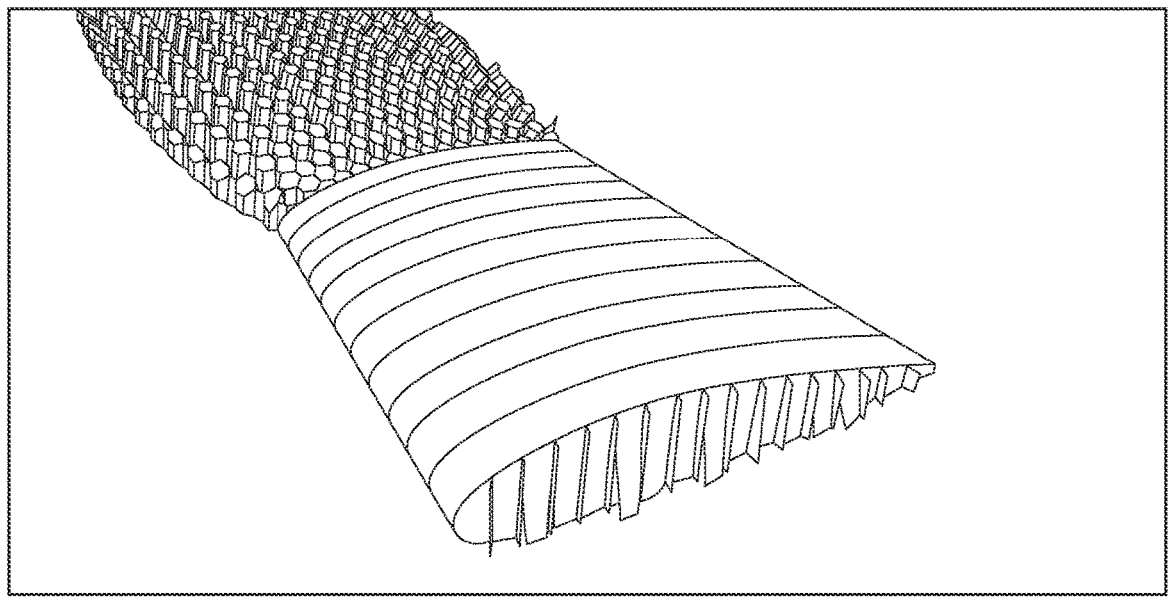

Buckle folding machines may also be constructed using modular instead of monolithic feed rollers. This has the advantage of not limiting overall size by the maximum roller that can be fabricated. Additionally, independent rollers may be driven and sensed independently. FIGS. 36A and 36B depict example modular rollers (FIG. 36A) for an example buckle folding system (FIG. 36B) that is a network of modular idler rollers, each with a high resolution encoder and independent lift adjustment. The encoder can be used to sense proper contact and tracking with the media, and the lift can be used to correct improper clamping pressure. Further, by differentially driving the lift of a set of modular rollers, skew in the media feeding through the machine may be corrected.

Applications.

For a many applications, relevant design parameters may be expressed in terms of the folding diagram for the 3D geometry. For instance, one application is to made aerodynamic surfaces, such as, but not limited to, aircraft wings and turbine blades. These shapes require complex geometries in order to attain high efficiencies, thus making it them an ideal application for the invention. A wind turbine blade can be specified by chord length, airfoil shape, and twist as a function of distance along the wing. Based on the constructions detailed above, all of these may be expressed in terms of parameters of the folding diagram.

FIGS. 37A-E depict steps in the construction of an example prototype of a wind turbine blade specified by chord length, airfoil shape, and twist as a function of distance along the wing, folded from a flat sheet. In FIGS. 37A-E there is shown a change in chord length and airfoil shape along the spanwise direction of the wing, folded from a flat sheet.

Another potential application includes the manufacture of shoe soles. In this case, tunable control over geometry and elastic properties is desired. For instance, the pronation angle, back-to-front drop, arch support, and flexural stiffness are all straightforward to express in terms of the folding diagram. Thus, no molds or tooling are required to make a sole with a desired geometry and stiffness. Another advantage is that a folded honeycomb according to the invention can eliminate the use of glues to join dissimilar materials. This means such a shoe could be much more recyclable at its end of life. Finally, folded honeycomb midsoles can be made much lighter than a conventional foam midsole. Prototype shoe soles are shown in FIGS. 27A-C, 28A-B, and 29A-B.

In addition, in the construction industry, there is a significant overuse of steel in structural beams due to the standardization of I-beam sizes. The energy cost of producing steel is high enough that the benefits of more tailored structural beam shapes would have a large effect. The folded construction technique of the invention can be employed to produce tailored structural elements from flat sheet stock with great efficiency.

Kirigami with Integrated Electronics.

The described techniques have focused on the arrangement of structural components (honeycomb cell walls) in three dimensions for a wide variety of geometries and structural responses. Applying kirigami techniques in conjunction with standard flexible circuit fabrication techniques to produce 3D volumes with integrated electronics. By attaching components to the flat media before undertaking the folding process, the described methods can be used as a means to arrange them in three dimensions. For instance, FIGS. 38A-D depict how standard flexible circuit production techniques can be combined with the described kirigami construction technique in order to produce three-dimensional electronics.

Figure 38A:
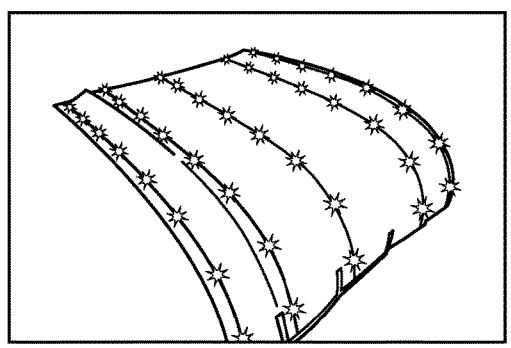
FIGS. 38A-D depict construction of an example kirigami honeycomb having integrated electronics, according to one aspect of the invention.
Figure 38B:
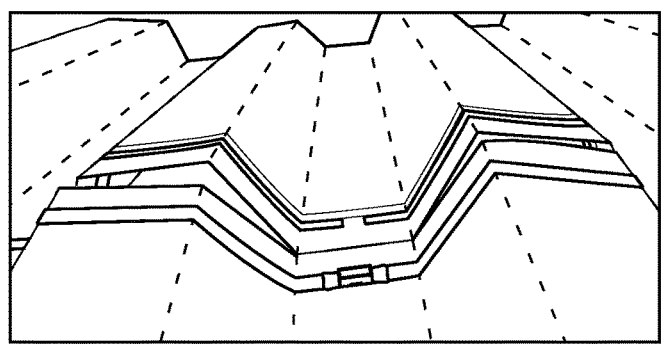
Figure 38C:
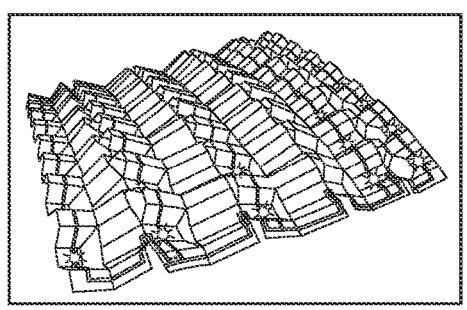
Figure 38D:
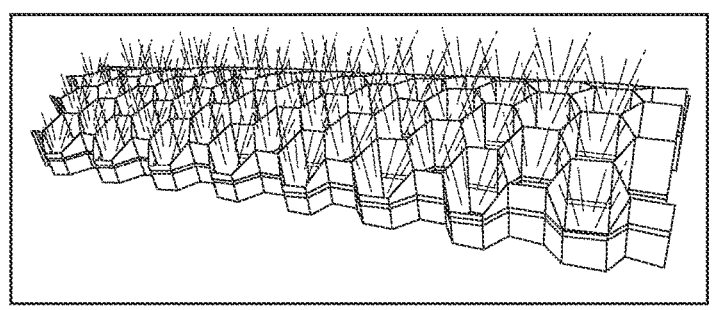

In the example shown in FIGS. 38A-D, a translucent base material is used with SMD LEDs to produce a lamp of a desired three-dimensional shape. Other examples could include, but are not limited to, sensing (such as, but not limited to, electromagnetic, light, sound, temperature) as well as actuation (such as, but not limited to, electromechanical, ultrasonic, optical). In FIG. 38A, flexible traces are applied to the base material using adhesive-backed copper. It will be clear to one of skill in the art that many flexible PCB manufacturing techniques are suitable for use in this aspect of the invention. Surface mount components can be added at this stage using high speed pick and place machines because the medium is flat. In FIG. 38B, cuts and corrugation folds are applied to the media without interfering with the circuit elements. In FIG. 38C, cross-sectional folds are created. FIG. 38D depicts the final three-dimensional object with integrated electronics, in this case LED illumination. Any of the joinery techniques described can be used finish the three-dimensional volume with integrated electronics.

While preferred embodiments of the invention are disclosed herein, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims.

What is claimed is:

1. A method of forming a structural honeycomb, comprising:
   cutting a substrate sheet according to a predetermined cutting pattern, the predetermined cutting pattern being formulated according to parameters derived for creation of a three-dimensional honeycomb having specific properties;
   after the step of cutting, folding the cut substrate sheet according to a predetermined folding pattern and at least one predetermined fold angle, wherein folding comprises at least contacting at least a first part of the substrate sheet against at least a second part of the substrate sheet that the first part of the substrate sheet did not abut before folding, the predetermined folding pattern being formulated according to parameters derived for creation of a three-dimensional honeycomb having specific properties, and the at least one predetermined fold angle being sufficient to cause the cut and folded substrate sheet to form a structural honeycomb having a plurality of cells, each cell having at least one face abutting, or nearly abutting, at least one face of another cell, wherein the predetermined cutting pattern and the predetermined folding pattern together comprise cut-and-fold instructions for the structural honeycomb, wherein parameters used in creating the cut-and-fold instructions for the structural honeycomb are calculated by:
   establishing functions t(x,y) and u(x,y), giving the height of the top and bottom, respectively, of the desired honeycomb shape for each x and y value; and
   calculating the parameters in terms of the values of functions t(x,y) and u(x,y) at the honeycomb coordinates t(i,j) and u(i,j); and
   stabilizing the structural honeycomb by joining one or more abutting, or nearly abutting, honeycomb faces in a manner that holds the structural honeycomb together.

2. The method of claim 1, wherein the cut-and-fold instructions include instructions to include or exclude cells in order that the structural honeycomb will have a prespecified outline.

3. The method of claim 1, wherein the cut-and-fold instructions include instructions to create a honeycomb wherein at least one of the top or bottom of the honeycomb forms an arbitrary shape along its length.

4. The method of claim 1, wherein the folding pattern specifies zig-zag corrugation folds in at least one direction.

5. The method of claim 1, wherein the folding pattern specifies canted corrugation folds in at least one direction.

6. The method of claim 1, further comprising the step of tuning the three-dimensional shape and material properties of the structural honeycomb by adjusting the parameters of the cut-and-fold instructions.

7. The method of claim 6, wherein the step of tuning includes adjusting an angle formed by the sides of each honeycomb cell by holding the cell width constant and changing the length of at least one cell side.

8. The method of claim 1, wherein the structural honeycomb is a volume-filling honeycomb.

9. The method of claim 1, wherein the step of stabilizing by joining employs reversible joinery.

10. The method of claim 9, wherein the reversible joinery employs at least one of slotted cross sections, tabbed strip joinery, angled strip joinery, an integral skin, sewn joinery, or laced joinery.

11. The method of claim 1, wherein the step of stabilizing by joining further comprises the step of constraining the width of the honeycomb cells by modifying features of a selected joining method.

12. The method of claim 1, wherein the step of stabilizing by joining further comprises the step of modifying features of a selected joining method to specify at least some partially-closed cross-sectional folds in order to create bends and twists in the honeycomb overall structure.

13. The method of claim 1, further comprising the step of at least partially covering at least one surface of the honeycomb with a skin or face sheet.

14. The method of claim 1, wherein the substrate sheet has at least one set of flexible electronic traces applied before at least one of the steps of cutting or folding.

15. A method of forming a structural honeycomb, comprising the steps of:
cutting a substrate sheet according to a predetermined cutting pattern, the predetermined cutting pattern being formulated according to parameters derived for creation of a three-dimensional honeycomb having specific properties;
folding the cut substrate sheet according to a predetermined folding pattern and at least one predetermined fold angle, the predetermined folding pattern being formulated according to parameters derived for creation of a three-dimensional honeycomb having specific properties, and the at least one predetermined fold angle being sufficient to cause the cut and folded substrate sheet to form a structural honeycomb having a plurality of cells, each cell having at least one face abutting, or nearly abutting, at least one face of another cell, wherein the predetermined cutting pattern and the predetermined folding pattern together comprise cut-and-fold instructions for the structural honeycomb, wherein parameters used in creating the cut-and-fold instructions for the structural honeycomb are calculated according to the following steps:
establishing functions t(x,y) and u(x,y), giving the height of the top and bottom, respectively, of the desired honeycomb shape for each x and y value; and
calculating the parameters in terms of the values of functions t(x,y) and u(x,y) at the honeycomb coordinates t(i,j) and u(i,j), according to the steps of:
calculating unshifted parameters A'(i,j), B'(i,j), C'(i,j), and D'(i,j), providing the cut-and-fold instructions parameters through the column shifts, according to the formulas $$A_{i,j} = A'_{i,j} + W_i$$

$$B_{i,j} = B'_{i,j} + W_i$$

$$C_{i,j} = C'_{i,j} + V_i$$

$$D_{i,j} = D'_{i,j} + V_i$$

calculating:

$$A'_{i,j} = \begin{cases} u(4i, j) & \text{if } j \equiv 0 \text{ or } j \equiv 1 \\ u(4i+1, j) & \text{if } j \equiv 2 \text{ or } j \equiv 3 \end{cases} \pmod 4$$

$$B'_{i,j} = \begin{cases} t(4i, j) & \text{if } j \equiv 0 \text{ or } j \equiv 1 \\ t(4i+1, j) & \text{if } j \equiv 2 \text{ or } j \equiv 3 \end{cases} \pmod 4$$

writing formulas for C'(i,j) and D'(i,j) recursively:

$$C'_{i,j} = \begin{cases} C'_{i,j-1} - t(4i+2, j) + t(4i+1, j-1) & \text{if } j \equiv 0 \\ C'_{i,j-1} - t(4i+2, j) + t(4i+2, j-1) & \text{if } j \equiv 1 \\ C'_{i,j-1} - t(4i+1, j) + t(4i+2, j-1) & \text{if } j \equiv 2 \\ C'_{i,j-1} - t(4i+1, j) + t(4i+1, j-1) & \text{if } j \equiv 3 \end{cases} \pmod 4$$

setting D'(i,0)=C'(i,0)+t(4i+2,0)−u(4i+2,0);
performing recursion according to the formula $$D'_{i,j} = \begin{cases} D'_{i,j-1} - u(4i+2, j) + u(4i+1, j-1) & \text{if } j \equiv 0 \\ D'_{i,j-1} - u(4i+2, j) + u(4i+2, j-1) & \text{if } j \equiv 1 \\ D'_{i,j-1} - u(4i+1, j) + u(4i+2, j-1) & \text{if } j \equiv 2 \\ D'_{i,j-1} - u(4i+1, j) + u(4i+1, j-1) & \text{if } j \equiv 3 \end{cases} \pmod 4;$$

and
calculating the offset parameters according to the formulas $$V_i = \max_j (B'_{i,j} - C'_{i,j}) \text{ and}$$

$$W_i = \max_j (D'_{i,j} - A'_{i,j+1}).$$

and
stabilizing the structural honeycomb by joining one or more abutting, or nearly abutting, honeycomb faces in a manner that holds the structural honeycomb together.

* * * * *